United States Patent
Dabral et al.

(10) Patent No.: US 12,424,455 B2
(45) Date of Patent: Sep. 23, 2025

(54) SEAL RING DESIGNS SUPPORTING EFFICIENT DIE TO DIE ROUTING

(71) Applicant: Apple Inc., Cupertino, CA (US)

(72) Inventors: Sanjay Dabral, Cupertino, CA (US); Chi Nung Ni, Foster City, CA (US); Long Huang, San Jose, CA (US); SivaChandra Jangam, Milpitas, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/509,801

(22) Filed: Nov. 15, 2023

(65) Prior Publication Data

US 2024/0096648 A1 Mar. 21, 2024

Related U.S. Application Data

(63) Continuation of application No. 17/460,806, filed on Aug. 30, 2021, now Pat. No. 11,862,481.

(60) Provisional application No. 63/158,632, filed on Mar. 9, 2021.

(51) Int. Cl.
*H01L 25/065* (2023.01)
*H01L 21/56* (2006.01)
*H01L 23/00* (2006.01)

(52) U.S. Cl.
CPC .......... *H01L 21/56* (2013.01); *H01L 24/32* (2013.01); *H01L 25/0655* (2013.01); *H01L 2224/32059* (2013.01); *H01L 2224/32137* (2013.01); *H01L 2924/183* (2013.01)

(58) Field of Classification Search
CPC .......... H01L 24/32; H01L 2224/32137; H01L 29/183
See application file for complete search history.

(56) References Cited

U.S. PATENT DOCUMENTS

| | | |
|---|---|---|
| 6,003,107 A | 12/1999 | Ranson et al. |
| 7,482,675 B2 | 1/2009 | Adkisson et al. |
| 7,518,229 B2 | 4/2009 | Cotte et al. |
| 8,164,171 B2 | 4/2012 | Lin et al. |
| 8,912,581 B2 | 12/2014 | Lin et al. |
| 8,952,497 B2 | 2/2015 | Chen et al. |
| 9,589,903 B2 | 3/2017 | Chen et al. |
| 9,852,998 B2 | 12/2017 | Chen et al. |
| 10,438,896 B2 | 10/2019 | Dabral et al. |

(Continued)

FOREIGN PATENT DOCUMENTS

WO 2013119309 A1 8/2013

OTHER PUBLICATIONS

Lindenmann et al., "Connecting Silicon Photonic Circuits to Multi-Core Fibers by Photonic Wire Bonding", Received from https://ieeexplore.ieee.org/document/6886114/, May 4-7, 2014 Optical Interconnects Conference, 7 pages.

(Continued)

*Primary Examiner* — Dale E Page
*Assistant Examiner* — Wilner Jean Baptiste
(74) *Attorney, Agent, or Firm* — Aikin & Gallant, LLP

(57) ABSTRACT

Chip sealing designs to accommodate die-to-die communication are described. In an embodiment, a chip structure includes a split metallic seal structure including a lower metallic seal and an upper metallic seal with overlapping metallization layers, and a through seal interconnect navigating through the split metallic seal structure.

25 Claims, 16 Drawing Sheets

(56) References Cited

U.S. PATENT DOCUMENTS

| | | | |
|---|---|---|---|
| 10,515,939 | B2 | 12/2019 | Chen et al. |
| 10,644,826 | B2 | 5/2020 | Wuu et al. |
| 10,930,599 | B2 | 2/2021 | Yang et al. |
| 10,985,107 | B2 | 4/2021 | Dabral et al. |
| 11,862,481 | B2 | 1/2024 | Dabral et al. |
| 2009/0160029 | A1 | 6/2009 | Pitts et al. |
| 2010/0193931 | A1 | 8/2010 | Do et al. |
| 2011/0049694 | A1 | 3/2011 | Chandrasekaran et al. |
| 2011/0215472 | A1 | 9/2011 | Chandrasekaran |
| 2013/0256659 | A1 | 10/2013 | Tsai et al. |
| 2014/0120696 | A1 | 5/2014 | Aleksov et al. |
| 2014/0312466 | A1 | 10/2014 | Frederick, Jr. et al. |
| 2014/0319522 | A1 | 10/2014 | Daubenspeck et al. |
| 2015/0262844 | A1 | 9/2015 | Meyer et al. |
| 2015/0294954 | A1 | 10/2015 | Leung et al. |
| 2015/0371938 | A1* | 12/2015 | Katkar ............... H01L 25/0652 438/666 |
| 2017/0092626 | A1 | 3/2017 | Yuan et al. |
| 2018/0090449 | A1 | 3/2018 | Jeong et al. |
| 2018/0294230 | A1 | 10/2018 | Dabral et al. |
| 2019/0181170 | A1 | 6/2019 | Oishi et al. |
| 2019/0319626 | A1 | 10/2019 | Dabral et al. |
| 2019/0393159 | A1 | 12/2019 | Chen et al. |
| 2019/0393409 | A1 | 12/2019 | Maniscalco et al. |
| 2020/0075497 | A1 | 3/2020 | Dabral et al. |
| 2020/0105682 | A1 | 4/2020 | Liu et al. |
| 2020/0176419 | A1 | 6/2020 | Dabral et al. |
| 2021/0098359 | A1* | 4/2021 | Vreeland ............... H01L 23/528 |

OTHER PUBLICATIONS

Billah et al., "8-Channel 448 Gbit/s Silicon Photonic Transmitter Enabled by Photonic Wire Bonding", Received from https://ieeexplore.ieee.org/stamp/stamp.jsp?tp=&arnumber=7937166, Optical Fiber Communications Conference and Exhibition (OFC) Mar. 19-23, 2017, 3 pages.

Masturzo et al., "Grating Couplers Fabricated by Electron-Beam Lithography for Coupling Free-Space Light Into Nanophotonic Device" Received from https://ieeexplore.ieee.org/stamp/stamp.jsp?tp=&arnumber=4359118, IEEE Transactions On Nanotechnology, vol. 6, No. 6, Nov. 2007, 5 pages.

Watanabe et al., "Perpendicular Grating Coupler Based on a Blazed Antiback-Reflection Structure", Received from https://opg.optica.org/DirectPDFAccess/F11E2B19-AF11-4B85-8E24B260C2561274_375299/jlt-35-21-4663.pdf?da=1&id=375299&seq=0&mobile=no, Journal of Lightwave Technology, vol. 35, No. 21, Nov. 1, 2017, 7 pages.

Gambino et al., "Reliability of Segmented Edge Seal Ring for RF Devices", Received from https://ieeexplore.ieee.org/document/6831836, IEEE International Interconnect Technology Conference, May 20-23, 2014, 4 pages.

Ditzel et al., "Low-Cost 3D Chip Stacking with ThruChip Wireless Connections" Received from https://ieeexplore.ieee.org/document/7478813, IEEE Hot Chips 26 Symposium (HCS), Aug. 10-12, 2014, 37 pages.

Niitsu et al., "Modeling and Experimental Verification of Misalignment Tolerance in Inductive-Coupling Inter-Chip Link for Low-Power 3-D System Integration", Received from https://ieeexplore.ieee.org/document/5208378, IEEE Transactions on Very Large Scale Integration (VLSI) Systems ( vol. 18, Issue: 8, Aug. 2010), Aug. 18, 2009, 6 pages.

Hopkins et al., "Circuit Techniques to Enable 430Gb/s/mm2 Proximity Communication", Received from https://ieeexplore.ieee.org/document/4242418, IEEE International Solid-State Circuits Conference. Digest of Technical Papers, Feb. 11-15, 2007, 3 pages.

Take et al., "3D integration using inductive coupling and coupled resonator (Invited)", Received from https://ieeexplore.ieee.org/document/7377882, IEEE International Symposium on Radio-Frequency Integration Technology (RFIT), Aug. 26-28, 2015, 3 pages.

Tadahiro Kuroda, "Proximity IOs using inductive coupling" Received from https://ieeexplore.ieee.org/document/6141767, IEEE International Symposium on Radio-Frequency Integration Technology, Nov.-Dec. 2, 2011, 4 pages.

Hsu et al., "Analytical thruchip inductive coupling channel design optimization", Received from https://ieeexplore.ieee.org/document/7428098, 21st Asia and South Pacific Design Automation Conference (ASP-DAC), Jan. 25-28, 2016, 6 pages.

Jourdain et al., "Extreme Wafer Thinning and nano-TSV processing for 3D Heterogeneous Integration", Received from https://ieeexplore.ieee.org/document/9159300, IEEE 70th Electronic Components and Technology Conference (ECTC), Jun. 3-30, 2020, 7 pages.

Prasad et al., "Buried Power Rails and Back-side Power Grids: Arm® CPU Power Delivery Network Design Beyond 5nm" Received from https://ieeexplore.ieee.org/document/8993617, IEEE International Electron Devices Meeting (IEDM), Dec. 7-11, 2019, 4 pages.

PCT/US2022/016785, "PCT International Search Report and Written Opinion of the International Searching Authority", mailed Jun. 7, 2022, 14 pages.

\* cited by examiner

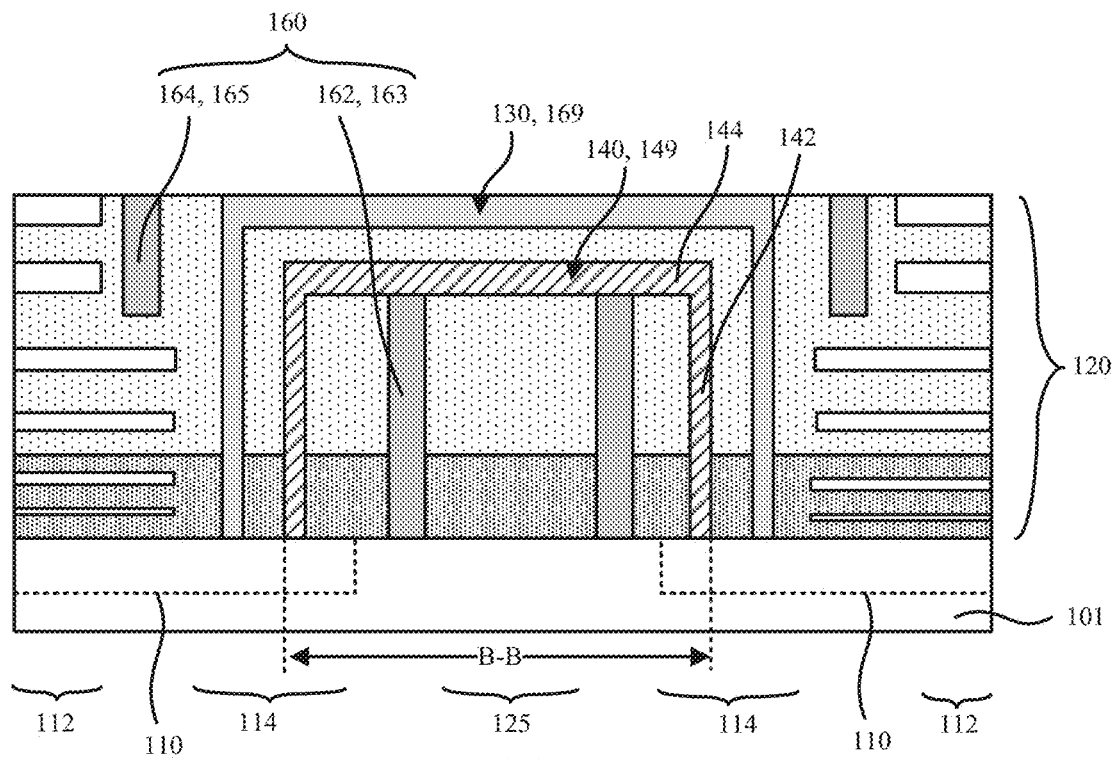
*FIG. 3A*
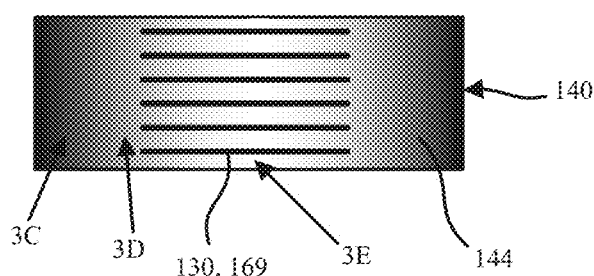
*FIG. 3B*
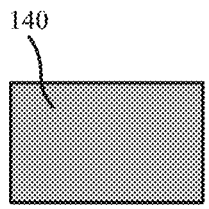 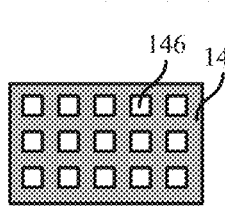 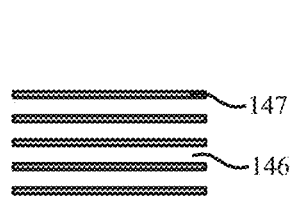
*FIG. 3C*   *FIG. 3D*   *FIG. 3E*

SEAL RING DESIGNS SUPPORTING EFFICIENT DIE TO DIE ROUTING

RELATED APPLICATIONS

This application is a continuation of co-pending U.S. application Ser. No. 17/460,806 filed Aug. 30, 2021, which claims the benefit of priority of U.S. Provisional Application No. 63/158,632 filed Mar. 9, 2021, both of which are herein incorporated by reference.

BACKGROUND

Field

Embodiments described herein relate to integrated circuit (IC) manufacture, and more particularly to seal ring designs and die connectivity and dicing.

Background Information

The current market demand for portable and mobile electronic devices such as mobile phones, personal digital assistants (PDAs), digital cameras, portable players, gaming, and other mobile devices requires the integration of more performance and features into increasingly smaller spaces. This trend toward smaller form factors has resulted in dies with higher circuit densities, and integration of different circuit blocks into the same substrates, such as with system-on-chip (SOC) dies.

Seal ring structures may commonly be integrated into dies to protect against the formation of defects such as cracking or delamination due to stress caused during singulation (dicing). Seal rings can provide additional protections, such as against moisture ingress and noise problems from separate circuit blocks. As such, seal rings may commonly be formed at the wafer scale during formation of the back-end-of-the-line (BEOL) build-up structure, and prior to singulation of dies from the wafer. More specifically, the seal rings may be formed from various continuous filled trenches and vias of the metallization layers in the BEOL build-up structure, and can completely surround the corresponding circuit areas in the dies, or separate circuit blocks within the dies.

In some circumstances, openings may be provided within the seal rings to allow for electrical interconnect lines to connect adjacent dies or circuit block areas within a die.

SUMMARY

Chip sealing structures which can accommodate die-to-die routing for inter-die or intra-die connections are described. In an embodiment, a through seal interconnect (portion of a die-to-die routing) extends through a split metallic seal structure including lower and upper metallic seals which can overlap in a same metallization layer to block a free line of sight. In other embodiments, sealed box structures are described in which the die-do-die routing jumps over the seal structures, or is formed on a back side of the semiconductor substrate and connected to through silicon vias (TSVs). In yet other embodiments, electromagnetic field communication structures are described to accommodate wireless die-to-die communication across sealing structures without physical wiring. The seal structures in accordance with embodiments may also guard against microcracking, delamination, moisture ingress, ion diffusion, etc. toward a die core region, even when adjacent a scribed die edge (e.g. through the die-to-die routing).

BRIEF DESCRIPTION OF THE DRAWINGS

FIG. 3A is a schematic cross-sectional side view illustration of a split metallic seal structure coupled with a metal plane in accordance with an embodiment.

FIG. 3B is a close-cup schematic top view illustration of metal plane density of the metal plane across area B-B of FIG. 3A in accordance with an embodiment.

FIG. 3C is a close-up schematic top view illustration of an unpatterned metal plane in accordance with an embodiment.

FIG. 3D is a close-up schematic top view illustration of a plurality of openings in a metal plane in accordance with an embodiment.

FIG. 3E is a close-up schematic top view illustration of a plurality of lines formed of a metal plane in accordance with an embodiment.

DETAILED DESCRIPTION

Figure 1A:
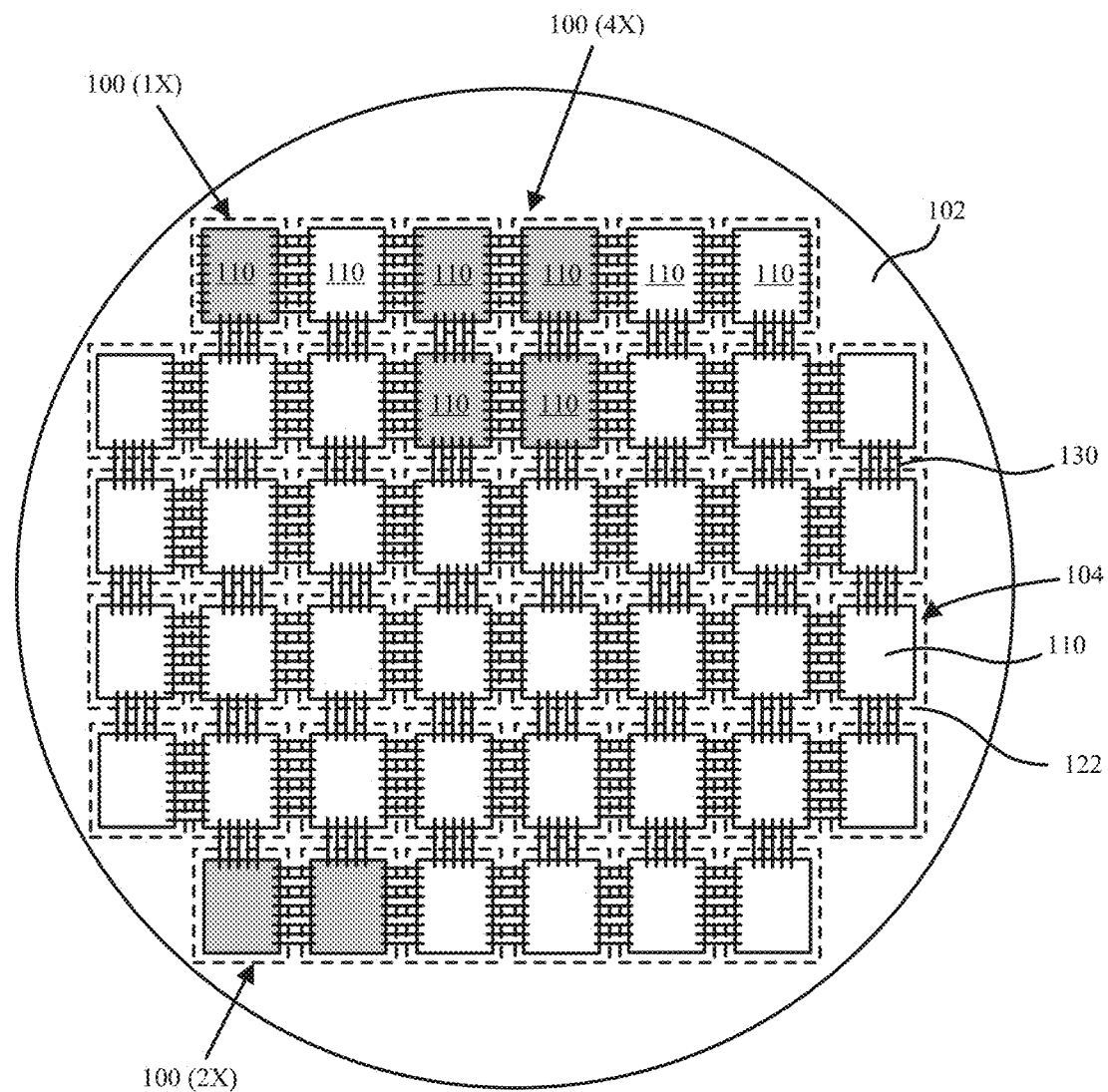
FIG. 1A is a schematic top view general layout plan illustration of a wafer including an array of front-end-of-the-line (FEOL) die areas in accordance with embodiments in which adjacent FEOL die areas are interconnected with die-to-die routing.

Embodiments describe chip sealing structures which can accommodate die-to-die routing for inter-die or intra-die connections. The chip sealing structures may facilitate interconnection between adjacent circuit blocks, as well as arrayed harvesting where variable die sets and shapes can be selected and harvested from a source wafer. Exemplary structures include split metallic seal structures where the die-to-die routing extends through the split metallic seal structures, sealed box structures where the die-to-die routing jumps over the seal structures, back side die-to-die routing using nano or micro through silicon vias (TSVs), and electromagnetic field communication to communicate across adjacent seal structures without physical wiring. The seal structures in accordance with embodiments may also guard against microcracking, delamination, moisture ingress, ion diffusion, etc. toward a die core region, even when adjacent a scribed die edge (e.g. through the die-to-die routing).

In one aspect, embodiments describe split metallic seal structures including lower and upper metallic seals which can overlap in a same metallization layer to block a free line of sight. Such a split metallic seal structure may allow for through seal interconnect routing to weave between the metallic seals, while the blocked free line of sight provides protection against microcracking, delamination, moisture ingress, ion diffusion, etc. As used herein, a through seal interconnect may be a portion of a die-to-die routing that extends through a split metallic seal structure, whether the die-to-die routing is diced or connects adjacent die areas.

In an embodiment a chip structure includes a semiconductor substrate, and a first front-end-of-the-line (FEOL) die area of a first die patterned into the semiconductor substrate. A back-end-of-the-line (BEOL) build-up structure is formed over the first FEOL die area, with the BEOL build-up structure including a plurality of metallization layers including lower metallization layers and upper metallization layers spanning over the first FEOL die area. The BEOL build-up structure further includes a split metallic seal structure including an inner metallic seal and an outer metallic seal arranged with one of the split metallic seals being a lower metallic seal overlapping (or rising from) the lower metallization layers and another of the split metallic seals being an upper metallic seal overlapping (or hanging from) the upper metallization layers. In accordance with embodiments, the inner metallic seal and the outer metallic seal can both be formed in the same metallization layer (or multiple metallization layers) of the plurality of metallization layers. A through seal interconnect (e.g. inter-die wiring or intra-die wiring) can weave between the inner and outer metallic seals, and extend from the first FEOL die area and into a scribe region laterally outside of the outer metallic seal. The scribe region can be diced, or alternatively unused (dummy) such that the through seal interconnect can connect to an adjacent inter-die area or intra-die area, and optionally through a corresponding split metallic seal structure of the adjacent inter-die area or intra-die area.

In another aspect, embodiments describe a sealed box structure which allows for the formation of die-to-die routing (inter-die or intra-die) while retaining full metallic seal (ring) structures without requiring openings or gaps to accommodate the die-to-die wiring. Such a sealed box structure may incorporate die-to-die routing over a passivated test pad layer, between the conventional top metallization layer in the BEOL build-up structure and the chip contact pads (e.g. under bump metallurgy, UBM, pads). This can allow die-to-die routing fabrication in a wafer fab, while scribing is performed after test.

In an embodiment, a chip structure includes a semiconductor substrate and a first FEOL die area of a first die patterned into the semiconductor substrate. A BEOL build-up structure is formed over the first FEOL die area, and includes a plurality of metallization layers including a lower metallization layer and an upper metallization layer spanning over the first FEOL die area. The BEOL build-up structure additionally includes a metallic seal extending from the lower metallization layer to the upper metallization layer, a passivation layer over the upper metallization layer and directly on the metallic seal, an opening in the passivation layer, a die-to-die routing filling the opening and extending into a scribe region laterally outside of the metallic seal, a passivation layer over the die-to-die routing, and a plurality of chip contact pads over the passivation layer. In this manner the semiconductor substrate, metallic seal, and passivation layer form a sealed box, over which the die-to-die routing is formed.

In another aspect, embodiments describe back side die-to-die routing that leverages through silicon vias (TSVs) to the FEOL process layers or lower level BEOL metallization layers. As such, die-to-die routing can be fabricated while keeping the metallic seals intact in the front-side, and without comprising FEOL layers and lower level BEOL dielectric layers that may have low-k materials that can be particularly susceptible to moisture penetration.

In an embodiment, a chip structure includes a semiconductor substrate and a first FEOL die area of a first die patterned into the semiconductor substrate. A BEOL build-up structure is formed over the first FEOL die area, and includes a plurality of metallization layers including a lower metallization layer and an upper metallization layer spanning over the first device region, a metallic seal extending from the lower metallization layer to the upper metallization layer. a passivation layer over the upper metallization layer and directly on the metallic seal, and a die-to-die routing extending from the first device region, through the semiconductor substrate to a back side of the semiconductor substrate, and over into a scribe region laterally outside of the metallic seal.

In yet another aspect, embodiments describe chip structures in which electromagnetic field communication structures, such as to facilitate capacitive, magnetic or photonic coupling, are integrated to communicate across adjacent seal structures without physical wiring. For example, coils or capacitors can be placed on opposite sides of a metallic seal, or over and under a passivation layer to facilitate communication across a sealed structure. As an option, repeater structures to receive and amplify and then re-transmit signals may be placed in the scribe area.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or in "contact" with another layer may be directly in contact with the other layer or may have one or more intervening layers. One layer "between" layers may be directly in contact with the layers or may have one or more intervening layers.

Referring now to FIG. 1A a schematic top view layout plan illustration is provided of a wafer 102 (e.g. silicon) including an array of dies 104 in which the adjacent FEOL die areas 110 of the dies 104 can be interconnected with die-to-die routing 130, along with appropriate signal return paths. The separate FEOL die areas 110 (also referred to herein more generically as die areas 110) and dies 104 in accordance with embodiments described herein (not limited to FIG. 1A) may include distinct circuit blocks from one another. Each die area 110 may represent a complete system, or sub-system. Adjacent die areas 110 may perform the same or different function. In an embodiment, die area 110 interconnected with die-to-die routing can include a digital die area tied to a die area with another function, such as analog, wireless (e.g. radio frequency, RF) or wireless input/output, by way of non-limiting examples. The tied die areas 110 may be formed using the same processing nodes, whether or not having the same or different functions. Whether each die 104 and die area 110 includes a complete system, or are tied subsystems, the die-to-die routing 130 may be inter-die routing (different systems) or intra-die routing (different, or same subsystems within the same system). For example, intra die-to-die routing may connect different subsystems within a system on chip, SOC, where inter die-to-die routing can connect different SOCs, though this is illustrative, and embodiments are not limited to SOCs. Thus, while the following description and embodiments are made primary with regard to inter-die connections, the embodiments and descriptions of die areas 110 are equally applicable for intra-die connections, between die areas 110 of distinct circuit blocks within the same die 104.

The die areas 110 and dies 104 in accordance with embodiments are not limited to specific systems or subsystems of an SOC. Harvesting may include dicing any number of units required, or even having more units than required and accepting one or more units that fail. Additionally, redundancy can be added by including one or more extra units (dies), or complete sub-systems. In event of a unit failure, a good unit can be swapped. Redundancy can be at the time of manufacture, or swappable in the field. Various applications include harvesting of engines such as graphics processing units (GPU), central processing units (CPU), signal processing engines, a neural engines (e.g. neural network processing engine), artificial intelligence (AI) engines, networks, caches, etc., memory device such as static random-access memory (SRAM), magnetic random-access memory (MRAM), nonvolatile random-access memory (NVRAM), dynamic random-access memory (DRAM), NAND, and cache memory, other components such as a capacitor, inductor, resistor, power management integrated circuit (IC), amongst others including interfacing bars for logic or memory expansion, and interposer substrates. Array harvesting may also be extended to other applications including solar, display, probe pin arrays for automated test equipment (ATE), field programmable gate arrays (FPGA), etc.

In accordance with embodiments, any or all FEOL die area edges can be configured to include die-to-die routing 130. In many embodiments, a portion of the this die-to-die routing 130 may be referred to as a through seal interconnect. Furthermore, each FEOL die area 110 may be surrounded by metallic seal 122 (e.g. metallic seal ring), which may be a split metallic seal structure or full seal structure depending upon the embodiment. As shown in FIG. 1A, dicing or scribe lanes can be located anywhere to accommodate yield (e.g. bad dies) or demand (e.g. need for larger die sets 100). This is illustrated by dies sets 100 including one die (1×), two dies (2×), four dies (4×), etc.

Figure 1B:
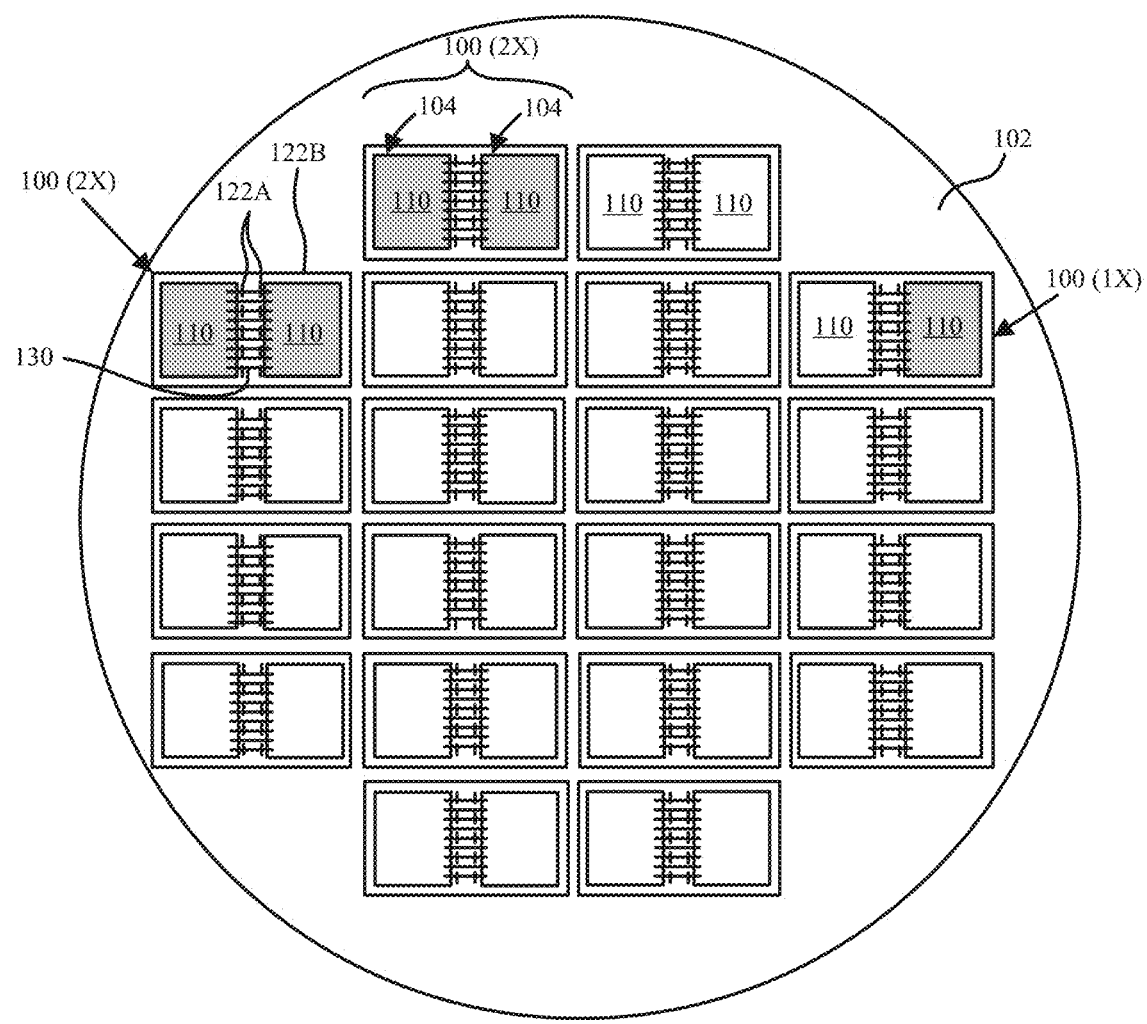
FIG. 1B is a schematic top view layout plan illustration of a wafer including an array of FEOL die area two-die sets in accordance with an embodiment in which the FEOL die area sets are interconnected with die-to-die routing.

FIG. 1B is a schematic top view layout plan illustration of a wafer including an array of pre-arranged die sets 100 in accordance with an embodiment in which the die sets 100 are interconnected with die-to-die routing 130. While the array of FEOL die areas 110 illustrated in FIG. 1A can allow for complete flexibility with scribing any combination of interconnected die sets, embodiments such as that illustrated in FIG. 1B also contemplate the arrangement of specific die sets connected with die-to-die routing. In such an embodiment, full metallic seal rings 122B can be provided around the die sets 100, while metallic seals 122A, split metallic seal structures or full seal structures depending upon the embodiment, are provided between adjacent FEOL die areas 110 within the die sets 100. Such a configuration may allow for additional metallic sealing of the scribed die sets, while still allowing for flexibility of scribing through the die-to-die routing 130 between adjacent FEOL die areas to facilitate improved wafer utilization. For example, such scribing may be performed to harvest a single die 104, remove a bad die 104, or harvest an irregular shape or custom number of dies 104 in a die set 100. As a contrast with FIG. 1A, which may be across multiple reticles, the embodiment illustrated in FIG. 1B may be within a reticle suitable for smaller systems. Staying within reticle may allow simpler stitching interconnection. Dicing can also be through the die-to-die routing 130 between die areas.

Figure 2A:
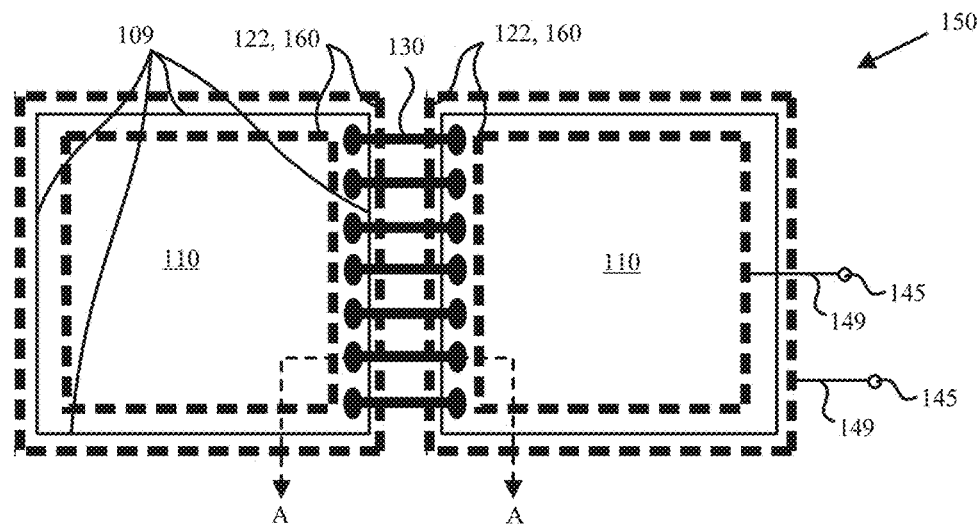
FIG. 2A is a schematic top plan view illustration of a chip including die-to-die routing extending through a split metallic seal structure in accordance with an embodiment.

Referring now to FIG. 2A, a schematic top view illustration is provided of a chip 150 including a die set and die-to-die routing 130 extending through a split metallic seal structure 160 in accordance with an embodiment. In the particular embodiments illustrated, the chip 150 includes a 2× die set similar to that illustrated in FIG. 1A, including metallic seals 122, which can be split metallic seal structures 160 to accommodate the die-to-die routing. It is to be appreciated that this configuration is exemplary, and split metallic seal structures 160 can be included in a variety of configurations, including the various die sets of FIGS. 1A and 1B, amongst other configurations. Accordingly, the illustration of FIG. 2A and the following description are understood to be a particular implementation of the embodiments described herein, rather than limiting. For example, in the particular embodiment illustrated in FIG. 2A, the split metallic seal structures 160 are only formed between adjacent die areas 110 that can accommodate die-to-die routing 130. However, embodiments are not so limited, and split metallic seal structures 160 can be formed along any die area 110 side 109. Furthermore, die-to-die routing 130 can be connected to any and all die area 110 sides 109.

Figure 2B:
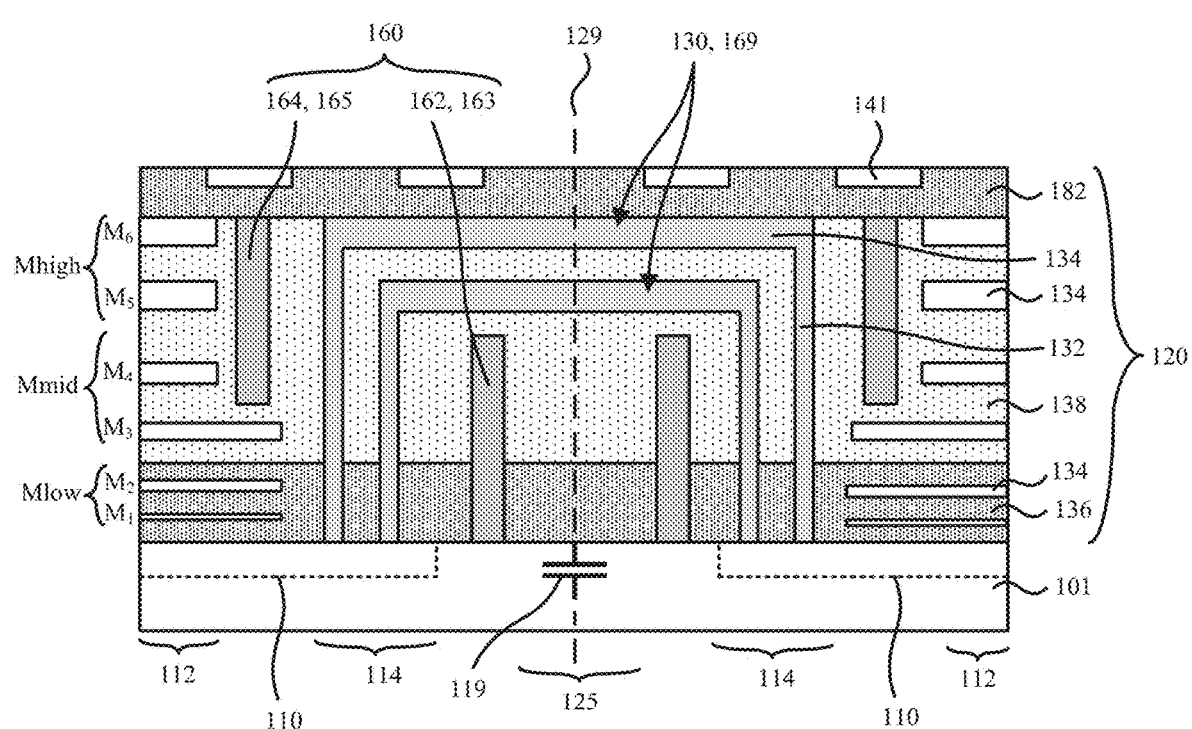
FIG. 2B is a close-up cross-sectional side view illustration of the die-to-die routing and split metallic seal structure across section A-A in the die set of FIG. 2A in accordance with an embodiment.

FIG. 2B is a close-up cross-sectional side view illustration of the die-to-die routing 130 and split metallic seal structure 160 across section A-A in the die set of FIG. 2A in accordance with an embodiment. As shown, the chip structure 150 includes a semiconductor substrate 101 (e.g. from wafer 102). As shown, a one or more FEOL die areas 110 can be patterned into the semiconductor substrate, and a BEOL build-up structure 120 formed over the one or more FEOL die areas 110. The FEOL die areas 110 can include input/output regions 114, core regions 112, etc. Wrapper regions may optionally be located adjacent to the core regions 112, including supporting logic, test, clocking, debug etc. for the core circuits of the core regions 112. The wrapper regions may additionally interface the core circuits to the input/output circuits of the input/output regions 114 to support the die-to-die routing 130.

Still referring to FIG. 2B, the BEOL build-up structure 120 includes a plurality of metallization layers 134, which may include lower metallization layers ($M_{low}$), mid-level metallization layers ($M_{mid}$) and upper metallization layers ($M_{high}$) spanning over the FEOL die areas 110. Each of the lower, mid-level, and upper metallization layers may each include one or more (e.g several) metallization layers dictated by design requirements. In accordance with embodiments, the metallic seals 122A may be split metallic seal structures 160 including an inner metallic seal 164 and an outer metallic seal 162 arranged with one of the inner metallic seal and the outer metallic seal being a lower metallic seal 163 overlapping the lower metallization layers ($M_{low}$) and the other of the inner metallic seal and the outer metallic seal being an upper metallic seal 165 overlapping the upper metallization layers ($M_{high}$). As used herein, the terms "inner" and "outer" when made with reference to the inner and outer metallic seals are made with reference to the core regions 112 relative to the scribe regions 125. Thus, the inner metallic seals 164 may be closer to the inner core regions 112 of a die than the outer metallic seals 162, which may be closer to the chip edges or scribe regions 125 (whether scribed, or connected to an adjacent die area). The split metallic seal structures 160 can be distinguished from full metallic seal structures, which may generally extend from the lowest lower metallization layers ($M_{low}$) to the uppermost upper metallization layers ($M_{high}$), forming a continuous wall.

In some embodiments at least some of the lower metallization layers may be formed between low dielectric constant (low-k) dielectric layers 136 (e.g. carbon doped silicon oxide, fluorinated silicon oxide, etc.). The higher metallization layers 134, such as the mid-level or upper metallization layers may optionally be formed between low-k dielectric layers or other dielectric layers 138 (e.g. silicon oxide, silicate glass, etc.). Low-k dielectric layers may be particularly susceptible to moisture ingress. Additional dielectric layers, metallization layers (including test pad layer, additional routing layers, etc.), and passivation layers illustrated elsewhere herein may be included in the structure illustrated in FIG. 2B above the upper metallization layers. A top passivation layer 182 (e.g. nitride, polyimide, etc.) is however illustrated, with top chip contact pads 141.

In accordance with embodiments a through seal interconnect 169 extends from the first FEOL die area 110, through the split metallic seal structure 160, and into a scribe region 125 laterally outside of the outer metallic seal 162. The through seal interconnects 169 may be at least a portion of the die-to-die routing 130 formed with vias 132 wiring layers of the metallization layers 134. If the die areas 110 are scribed through the scribe region 125, then the scribe line 129 can go through terminal ends of the through seal interconnects 169/die-to-die routing 130. If the die areas 110 are not scribed then the through seal interconnects 169 can pass through the split metallic seal structures 160 for both adjacent dies.

In accordance with embodiments, portions of the outer metallic seal 162 (e.g. lower metallic seal 163) and the inner metallic seal 164 (e.g. upper metallic seal 165) are both formed in at least one same metallization layer 134. This may facilitate blocking a clear (lateral) line of sight and protect against the formation of defects such as cracking or delamination, moisture ingress or for diffusion should dicing be performed through the scribe region 125.

Referring now again to FIG. 2A, the split metallic seal structure 160 can be coupled to one or more charge sources or sinks 145 to control potential of at least one of the inner metallic seal 164 and the outer metallic seal 162. The charge sources or sinks may be the same or different sources or sinks, such as low voltage source (Vss) inclusive of ground or lower operating voltage source, or other charge source such as power (e.g., high voltage, Vdd) or reference voltage, or even floating (high impedance connections, or alternating current coupled or both). The charge sources or sinks 145 may be connected to the split metallic seal structure 160 with charge source or sink routing 149 connected to, or within, the semiconductor substrate 101, or interconnected to the split metallic seal structure 160 through one or more metallization layers or vias within the BEOL build-up structure 120.

Figure 2C:
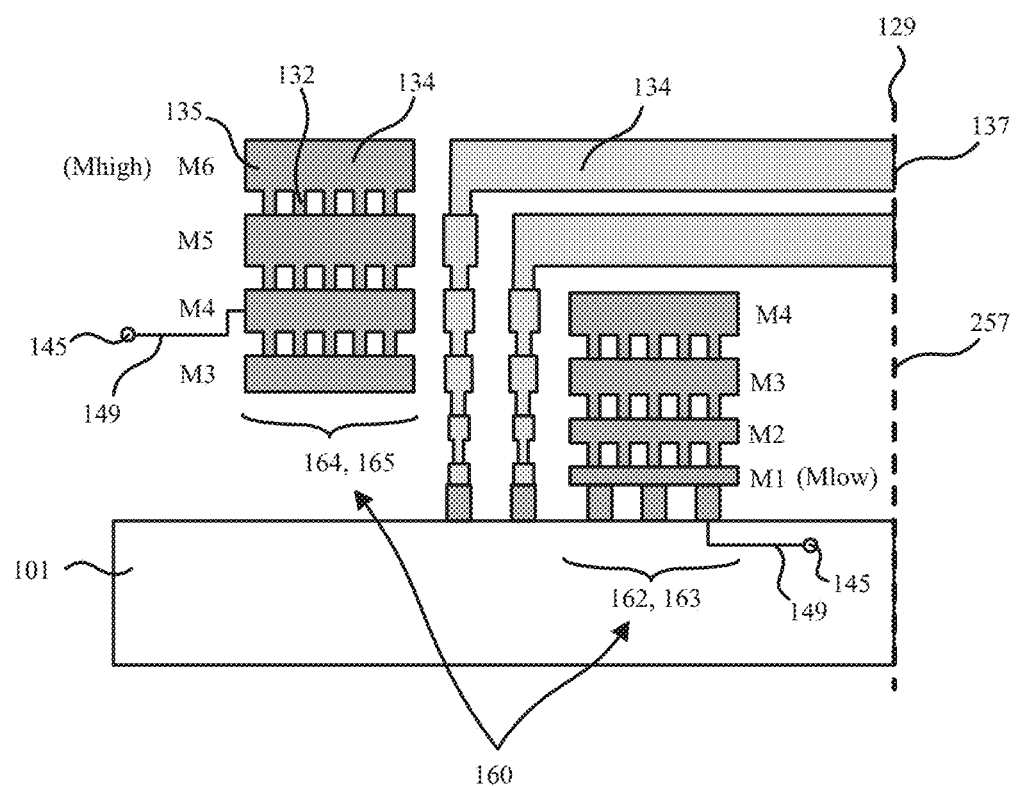
FIG. 2C is a close-up cross-sectional side view illustration of the plurality of metallization layers forming the split metallic seal structure in the die set of FIG. 2A in accordance with an embodiment.

FIG. 2C is a close-up cross-sectional side view illustration of the plurality of metallization layers forming the split metallic seal structure in the die set of FIG. 2A in accordance with an embodiment. As shown, both the inner metallic seals 164 and outer metallic seals 162 can be formed of multiple via 132 walls and wiring layers 135 (e.g. trenches) of the metallization layers 134. In a dual damascene structure this may include continuous filled trenches (wiring layers 135) and vias 132. Similarly, the schematic via 132 illustrations of FIG. 2B for the die-to-die routing 130 may include stacked vias 132 and wiring layers 135.

As shown in FIGS. 2A-2C, the split metallic seal structures 160 in accordance with embodiments may allow for a continuous die-to-die routing 130 between adjacent die areas 110. Additionally, while die-to-die routing 130 may navigate through multiple metallization layers 134, the formation of a blockage to a lateral line of sight can provide physical, chemical, and electrical protection to the die areas 110. In the particular embodiments illustrated in FIGS. 2A-2C the outer metallic seal 162 is outside (exterior to) the input/output region 114 and the inner metallic seal 164 is between the input/output region 114 and the core region 112 including the core logic circuits of the die. For example, the inner metallic seal 164 may be located within what is traditionally termed a keep out zone (KOZ) between a core region 112 including core logic and outer input/output region 114. In this manner the full sealing potential of the split metallic seal structures 160 is provided for the core region 112, while at the same time providing access of the die-to-die routing 130 (and hence through seal interconnects 169) to the input/output region 114 and a continuous die-to-die routing 130. Additional modifications are possible. For example, referring again to FIG. 2B, a decoupling capacitor 119 can be placed in the scribe region 125 for use when adjacent die areas 110 are to be connected, and scribed out when adjacent die areas 110 will not be connected. This can reduce demand on the dies and core regions 112, for example with SOC, and additionally reduce wiring length.

Referring again to FIG. 2C, in accordance with embodiments dicing may be performed through the scribe regions 125 when harvesting chips 150 including one or more die areas 110. As shown, a terminal end 137 of the through seal interconnect (die-to-die routing 130) may result at the chip edge 257.

Referring now to FIGS. 3A-3B, FIG. 3A is a cross-sectional side view illustration of a split metallic seal structure 160 coupled with a metal plane 140 of a charge source or sink routing 149 in accordance with an embodiment, and FIG. 3B is a close-cup schematic top view illustration of the metal plane 140 density of the charge source or sink routing 149 across area B-B of FIG. 3A in accordance with an embodiment. The charge source or sink may be a variety of sources such as low voltage source (Vss) inclusive of ground or lower operating voltage source, or other charge source such as power (e.g., high voltage, Vdd) or reference voltage, or even floating. In an exemplary embodiment a charge source or sink routing 149 return can be shorted (e.g. grounded for a Vss sink) to the outer metallic seal 162 of the split metallic seal structure 160. The inner metallic seal 164 can similarly be connected to a charge source or sink routing. This can potentially control crosstalk, while also providing a sealing function. Similar to the die-to-die routing 130, the metal plane 140 can be formed in a metallization layer 144 (which can be a same layer as metallization layer 134) and vias 142 (which can be similar to vias 132). In an embodiment, the metallization layer 144, rather than including conventional interconnect lines can include a metal plane 140. FIG. 3B illustrates interconnect lines of die-to-die routing 130 superimposed over a metal plane 140 of the (e.g. Vss) sealing structure. Thus, the metal plane 140 can be formed directly on top of the outer metallic seal 162, which can form a sealing wall, while the metal plane 140 forms a sealing roof, or ceiling. Additionally, the through seal interconnects 169 (e.g. die-to-die routing) includes wiring that spans directly over the metal plane 140.

Still referring to FIG. 3B density of the metal plane 140 can be varied by area location. For example, the metal plane 140 may have a lower metal density in the scribe region 125 than in the die area 110. For example, this may be achieved by patterned openings through the metallization layer 144 (see FIG. 6A) to reduce metal density. Thus, more openings may correspond to a reduced density, with a reduced density facilitating dicing. In an embodiment, the metal plane 140 is denser laterally inside the outer metallic seal 162 than laterally outside of the outer metallic seal 162. The metal density may be graded. Referring now to FIGS. 3C-3E, FIG. 3C illustrates a high metal density with an unpatterned metal plane 140 in area 3C of FIG. 3B. FIG. 3D illustrates a plurality of openings 146 in the metal plane 140 in area 3D of FIG. 3B, which reduces the overall metal density. The openings 146 may be a variety of shapes, and may accommodate jogs described elsewhere herein. FIG. 3E illustrates a plurality of lines 147 formed of the metal plane 140 in area 3E of FIG. 3B. For example, the metal lines 147 may have the same or similar density as the die-to-die routing (through seal interconnects 169). These are merely exemplary illustrations which show a possible graded metal density, and it is understood a variety of alternative arrangements are envisioned.

It is to be appreciated that various illustrations herein, such as FIG. 3A, are partial chip structure illustrations, and that additional dielectric layers, metallization layers (including test pad layer, additional routing layers, etc.), and passivation layers illustrated elsewhere herein may be included above the upper metallization layers. Thus, it is to be appreciated that additional structures may be included and that the illustrations provided are instead focused on specific structures in order to not unnecessarily obscure the embodiments.

Up until this point, and in particular the close-up schematic cross-sectional side view illustrations in FIGS. 2B and 3A have illustrated the inner metallic seal 164 being between the input output regions 114 and core regions 112 (e.g. main logic) of the die areas 110 (i.e. within the keep out zone (KOZ)). Additionally, the outer metallic seals 162 can be over the die areas 110, within the scribe regions 125, or between the die areas 110 and scribe regions 125. Such arrangements can help shield the core region, while allowing for navigation of the through seal interconnects. In accordance with embodiments, buffers can be located in various locations to facilitate the passage of signals between the core regions 112, or adjacent wrapper regions 113, and the input/output regions 114. Wrapper regions may be supporting logic regions that interface the core region 112 circuits to the input/output region 114 circuits, for example for die-to-die communication. In addition to logic, they may support test, clocking, debug etc. In some configurations, it may be desirable to have no or minimum wrapper regions and the continue core region fabric. Thus, in the following embodiments, wrapper region and core region are described as being either separate or same regions.

Figure 4A:
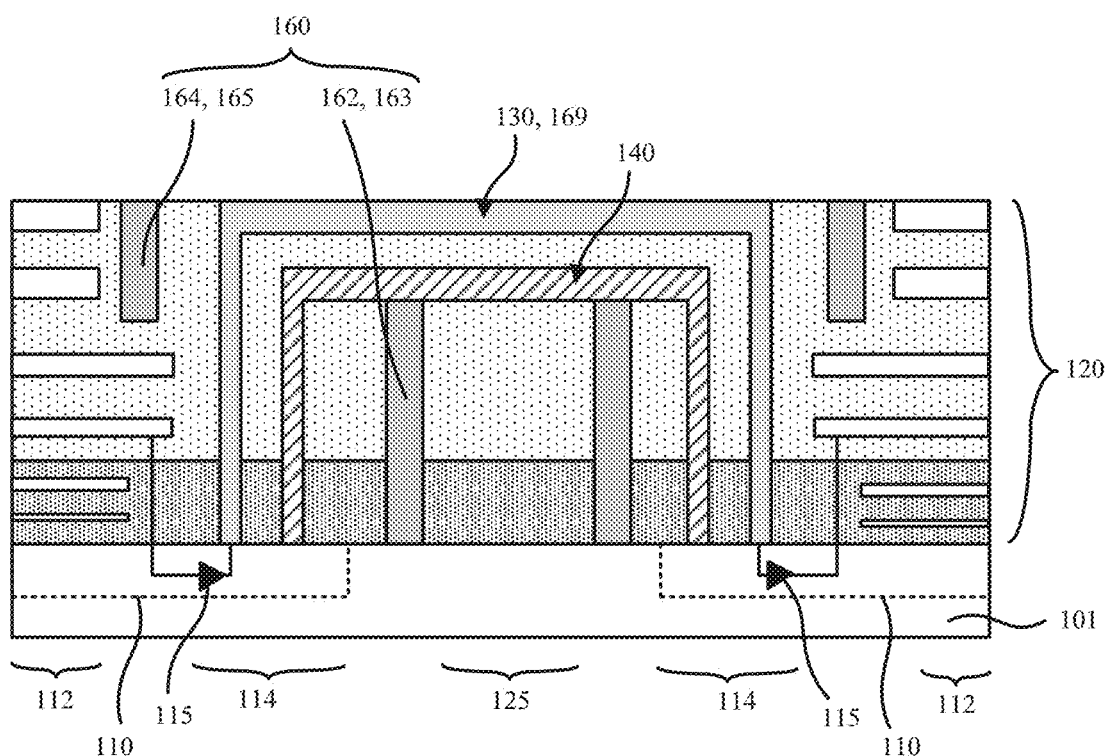
FIG. 4A is a schematic cross-sectional side view illustration of a die-to-die routing including a buffer in an I/O region in accordance with an embodiment.
Figure 4B:
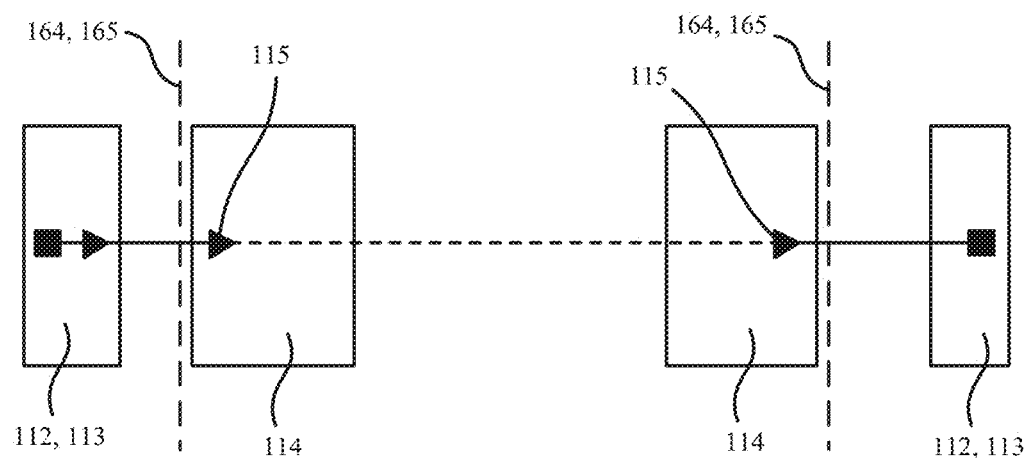
FIG. 4B is a schematic top view illustration of the buffer arrangement of FIG. 4A in accordance with an embodiment.

Referring now to FIGS. 4A-4B schematic cross-sections side view and top view illustrations are provided of a die-to-die routing including a buffer 115 in an I/O region 114 in accordance with an embodiment. As shown, the I/O region 114 can be electrically connected with the core region 112 or wrapper region 113 through one or more metallization layers 134, while a buffer 115 is located in the I/O region 114, for example to provide driving function, isolation function (e.g. between the core region 112 and I/O region 114 when scribed) and optionally electrostatic discharge (ESD) or electro-overstress (EOS) isolation should dicing be performed through the scribe region 125. Such a configuration may require area within the input/output region 114 of the die.

It is to be appreciated that the exemplary embodiment described and illustrated in FIGS. 4A-4B includes signal routing and metal plane 140 of FIG. 3A-3B. The metal plane 140 may be connected to charge source or sinks, such as low voltage source (Vss) inclusive of ground or lower operating voltage source, or other charge source or sink such as power (e.g., high voltage, Vdd) or reference voltage, or even floating (high impedance connections, or alternating current coupled or both). It is to be appreciated that this is exemplary, and while the embodiments are combinable, it is not required. Thus, in the following description, illustration of various embodiments within the same figures is meant for convenience, and to not distract from the various illustrated structures being described. Thus, illustration of various embodiments within the same figures, while demonstrating compatibility of the various embodiments, is not to be interpreted as being required features to all embodiments.

Figure 5A:
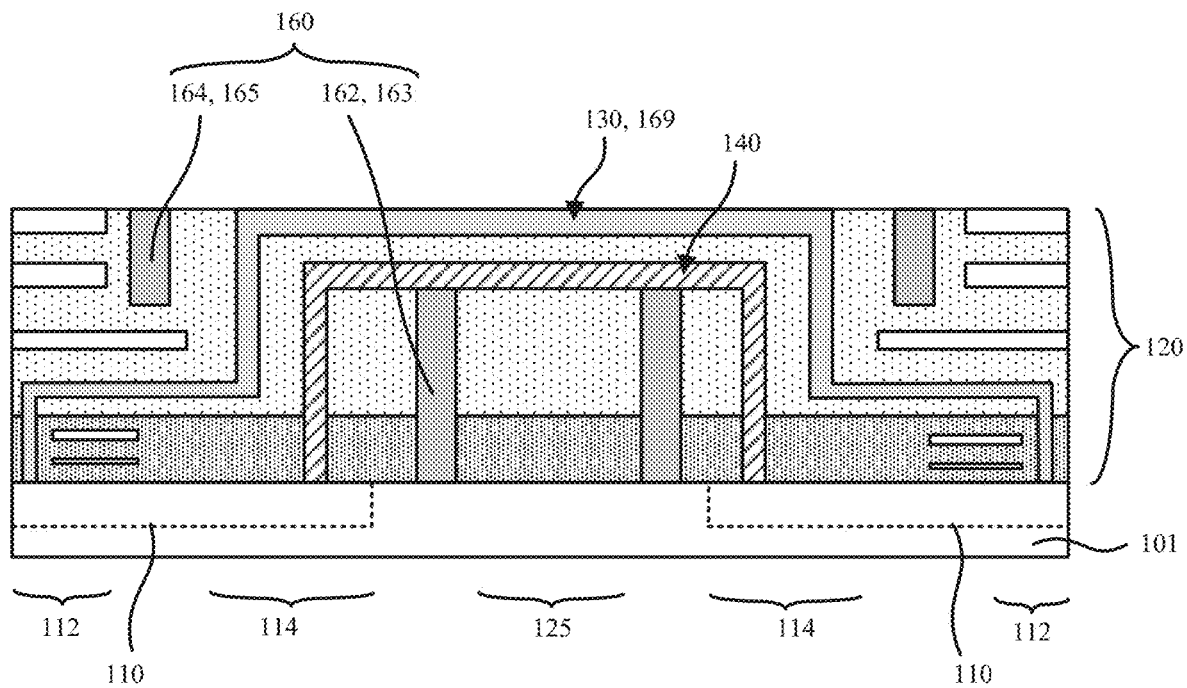
FIG. 5A is a schematic cross-sectional side view illustration of a die-to-die routing including a buffer in a wrapper region in accordance with an embodiment.
Figure 5B:
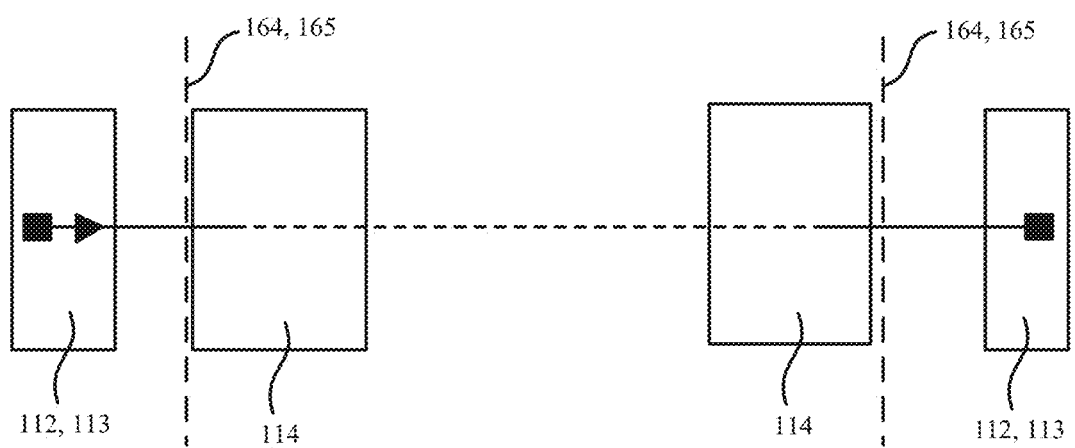
FIG. 5B is a schematic top view illustration of the buffer arrangement of FIG. 5A in accordance with an embodiment.

Yet another arrangement for buffer location is illustrated in FIGS. 5A-5B where a buffer 115 is instead located within the core region 112 or adjacent wrapper region 113 instead of the I/O region 114. Such as configuration may allow for reduced die-to-die routing 130 distance, and area. More specifically, less area is used for the I/O region 114 compared to configurations where buffers are located in the I/O regions 114.

Figure 6A:
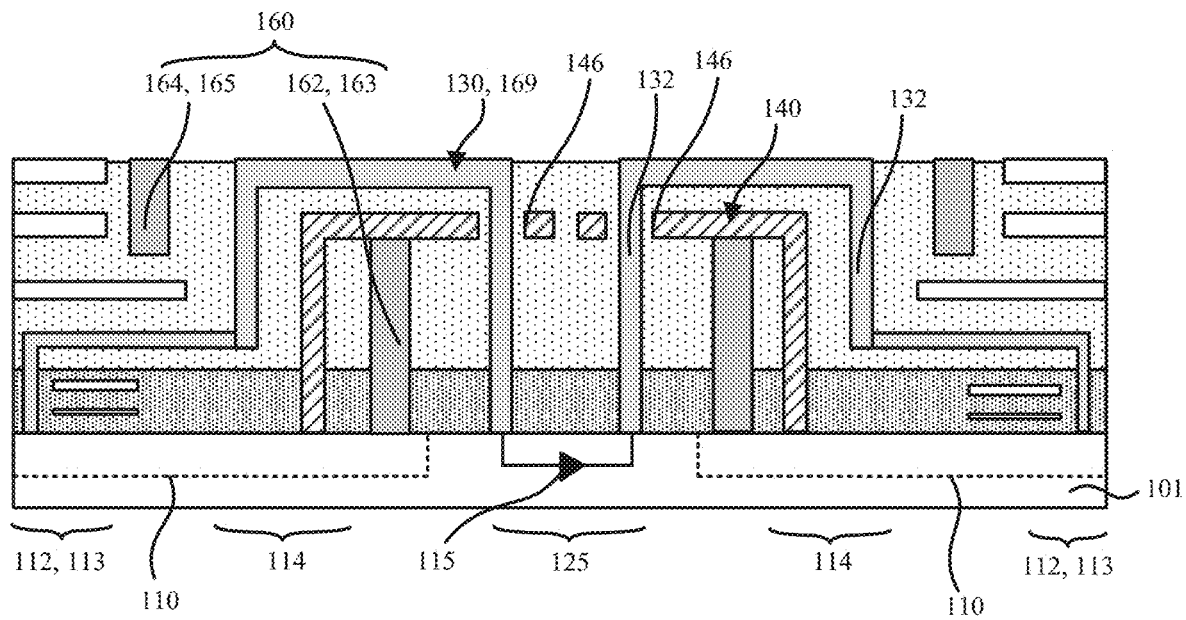
FIG. 6A is a schematic cross-sectional side view illustration of a die-to-die routing including a buffer in a scribe region in accordance with an embodiment.
Figure 6B:
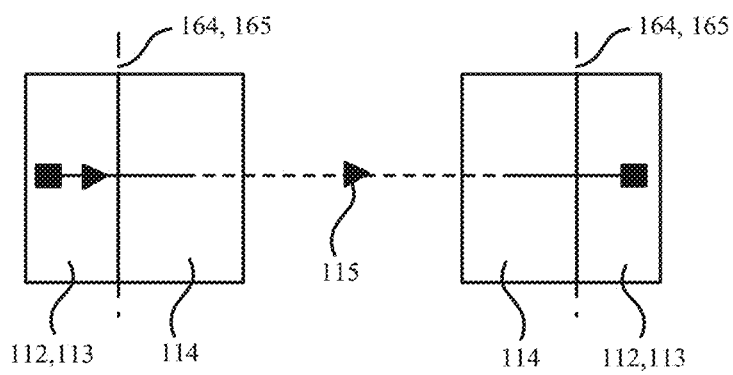
FIG. 6B is a schematic top view illustration of the buffer arrangement of FIG. 6A in which the buffer is coupled with a wrapper region near an I/O region in accordance with an embodiment.
Figure 6C:
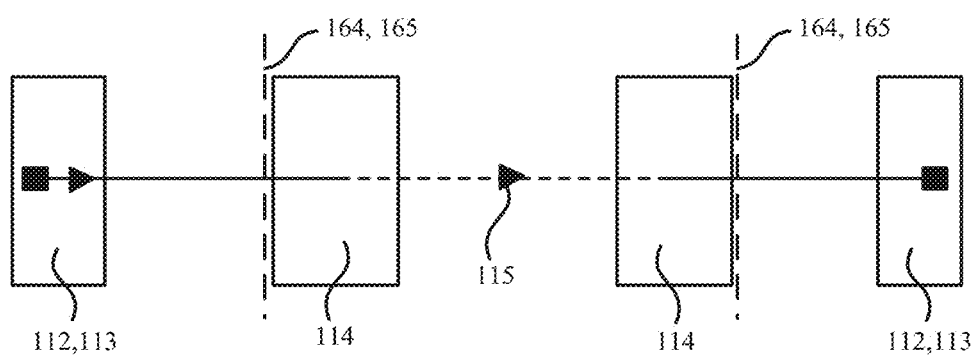
FIG. 6C is a schematic top view illustration of the buffer arrangement of FIG. 6A in which the buffer is coupled with a deep core wrapper region in accordance with an embodiment.

Additional embodiments are illustrated in FIGS. 6A-6C where a buffer 115 is instead located within the scribe region 125. Such arrangements can take advantage of this additional area, where it is only used when adjacent dies are unscribed (e.g. joined), and connected with die-to-die routing 130. FIG. 6A is substantially similar to FIG. 5A with a difference being additional vias 132 (or more specifically stacked vias 132 and metallization layers 134 or trenches as shown in FIG. 2C) for the die-to-die routing 130 to connect with the buffer 115 outside of the outer metallic seal 162 within the scribe region 125. Additionally, decoupling capacitors supporting the power network for the buffer, and other circuits, may also be placed in the scribe region 125. These additional vias 132 may extend through openings 146 in the metal plane 140. Such a configuration may allow for both a reduced die-to-die routing 130 distance by taking advantage of a "free" area. As shown in FIGS. 6B-6C, this can also allow the transmission signals to be send from near core regions 112 or wrapper regions 113 as shown in FIG. 6B or "deep" core (circuit) regions 112 or wrapper regions 113 within an interior of the dies or the core regions 112 further away. These can reduce latency and also provide on-chip fabric extensions.

Figure 7A:
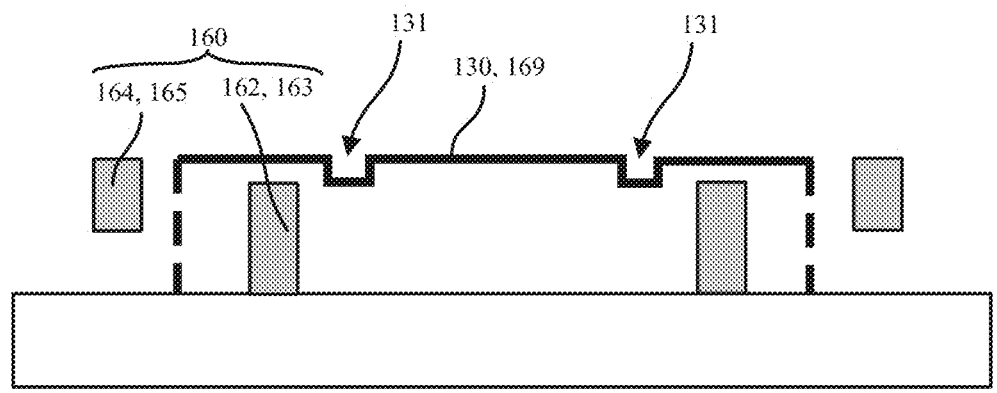
FIG. 7A is a schematic side view illustration of a die-to-die routing including a jog in accordance with an embodiment.
Figure 7B:
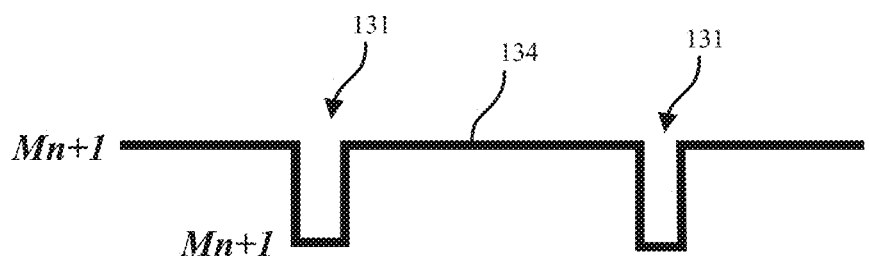
FIG. 7B is a schematic top view illustration of a horizontal jog within a same metallization layer in accordance with an embodiment.
Figure 7C:
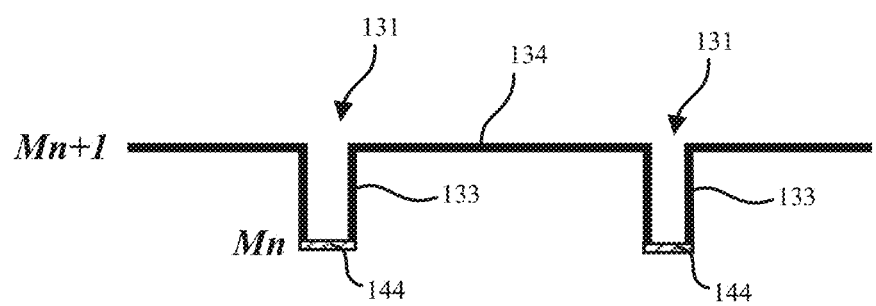
FIG. 7C is a schematic side view illustration of a vertical jog between multiple metallization layers in accordance with an embodiment.
Figure 7D:
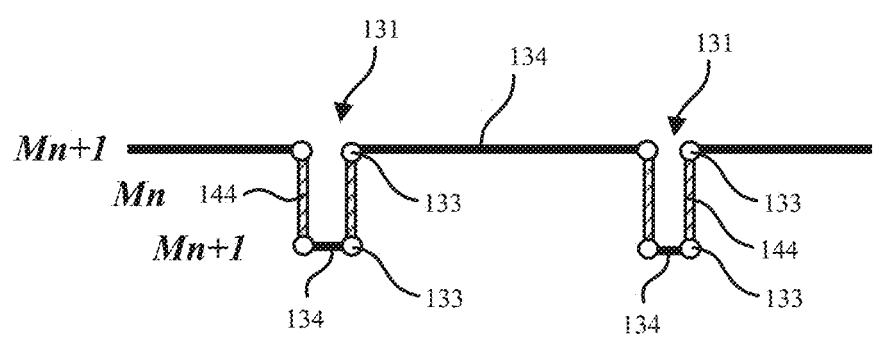
FIG. 7D is a schematic top view illustration of die-to-die routing including a hybrid vertical and horizontal jog in accordance with an embodiment.
Figure 7E:
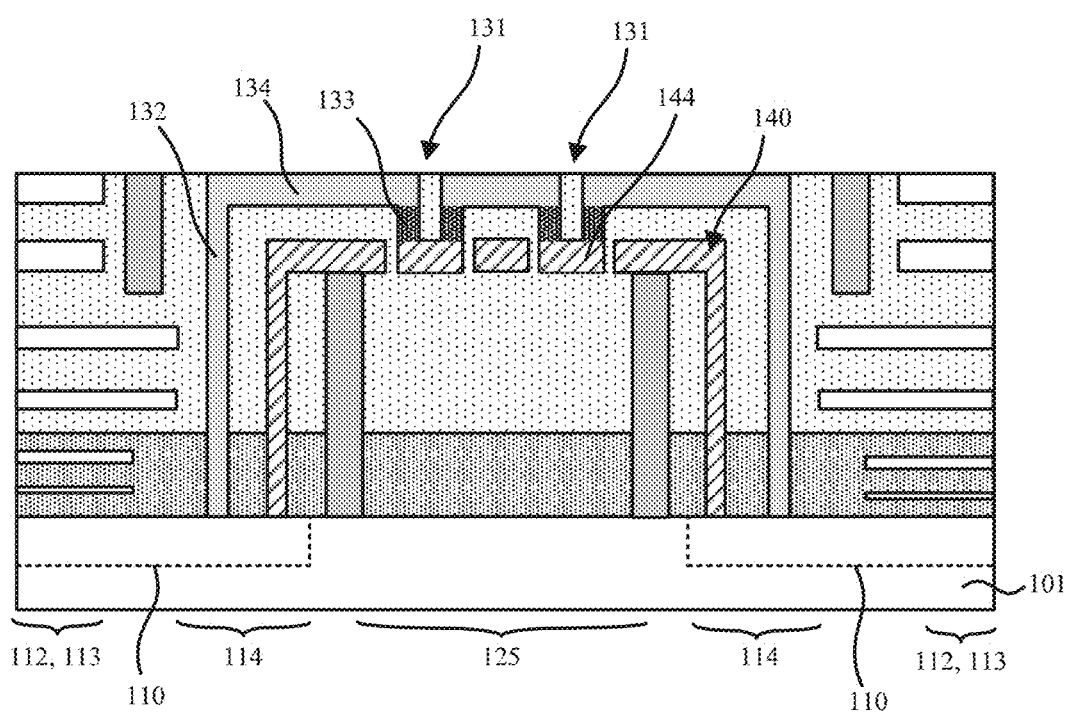
FIG. 7E is a schematic cross-sectional side view illustration of a die-to-die routing including a vertical jog in accordance with an embodiment.

Referring now to FIGS. 7A-7E additional die-to-die routing 130 modifications can be incorporated into the embodiments described herein. In particular, horizontal or vertical jogs 131 can be included, which may provide additional protection to crack propagation, ion diffusion or delamination. FIG. 7B is a schematic top view illustration of a horizontal jog within a same metallization layer 134 in accordance with an embodiment. As shown the jog 131 can be a non-straight line interconnect within a same metallization layer 134 (Mn+1). By comparison, FIG. 7C is a schematic side view illustration of die-to-die routing 130 including vertical jog 131 in which the routing is connected between multiple metallization layers 144, 134 (Mn, Mn+1) with vias 133. FIG. 7D is a schematic top view illustration of die-to-die routing 130 including a hybrid vertical and horizontal jog 131. Thus, FIG. 7D combines features of FIGS. 7B-7C, where a non-straight line interconnect is formed within multiple metallization layers 144, 134 (Mn, Mn+1) to form the horizontal jog portion, where vias 133 connect the multiple metallization layers 144, 134 (Mn, Mn1) to form the vertical jog portion. FIG. 7E is a schematic cross-sectional side view illustration of a die-to-die routing 130 including a vertical jog 131 in accordance with an embodiment. In the particular embodiment illustrated the vertical jog 131 dips into a lower metallization layer 144 used for the metal plane 140 of the charge source or sink sealing structure previously described. It is to be appreciated that such a configuration is exemplary, and the vertical jogs 131 can be formed in a variety of metallization layers 134, including those sharing other die-do-die routing 130 lines.

While the above descriptions of horizontal and vertical jogs 131 were made and illustrated separately, it is to be appreciated that embodiments may combine both horizontal and vertical jogs 131 within the same die-to-die routing 130 lines, or separate die-to-die routing 130 lines in the same chip structure. Horizontal jogs 131 in particular may mitigate straight crack propagation, and may be particularly applicable in lower density die-to-die routing 130 architecture where ample space is available. Vertical jogs 131 in particular may staple layers together to mitigate delamination and microcrack propagation. Combinations of horizontal and vertical jogs 131 in particular may be implemented by lowering the topmost metallization layer/via for the outer metallic seal 162 to accommodate routing of the vertical jogs 131. Combinations of horizontal and vertical jogs 131 can also be used for rotating the die-to-die routing 130 lines. For example, this may resemble a bundled cable, where the wires of the die-to-die routing 130 are twisted. Such a configuration may average cross-talk among the wires of the die-to-die routing 130.

Figure 8:
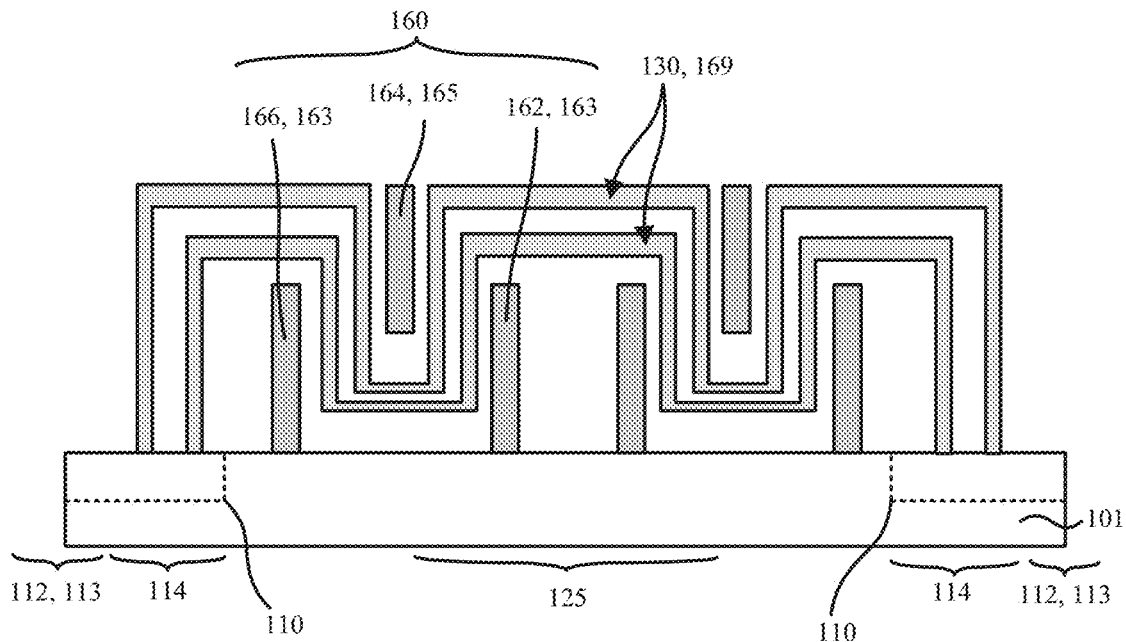
FIG. 8 is a schematic top view illustration of a die set including die-to-die routing extending through a split metallic seal structure in accordance with an embodiment.
Figure 9:
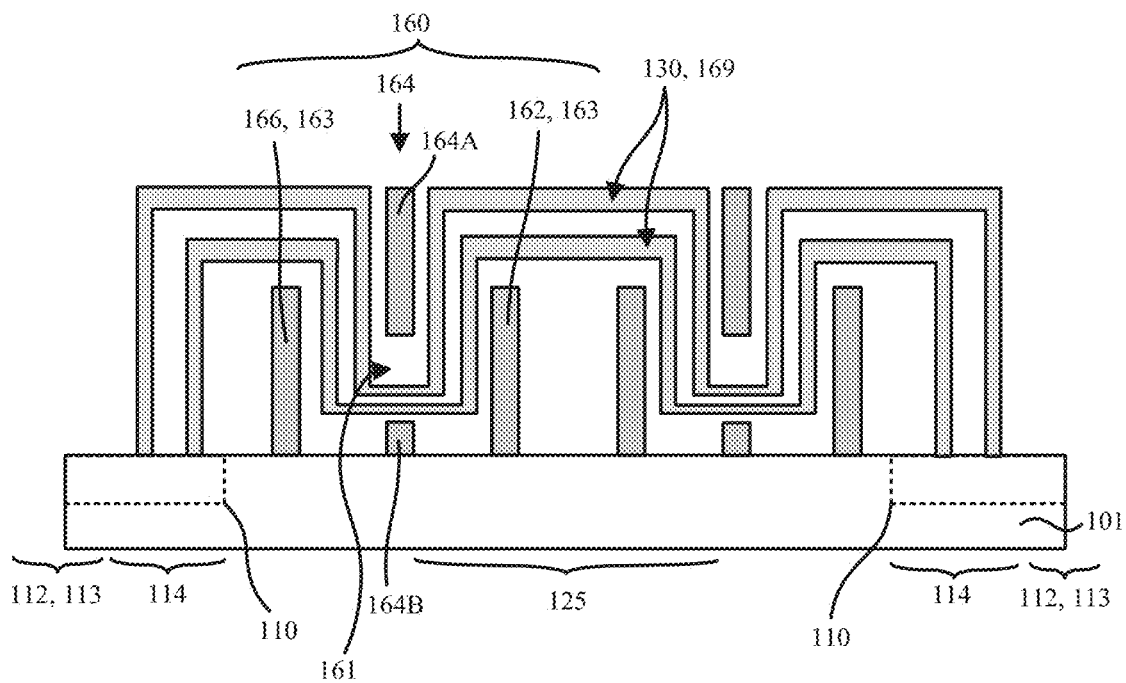
FIG. 9 is a schematic top view illustration of a die set including die-to-die routing extending through a split metallic seal structure including a partial metallic seal structure in accordance with an embodiment.

Additional configurations for split metallic seal structures 160 are envisioned in accordance with embodiments, for example to elongate diffusion lengths for moisture and ions or provide additional mechanical protection. In the embodiment illustrated in FIG. 8, the split metallic seal structure 160 includes an additional second inner metallic seal 166, which can be a second lower metallic seal 163. Compared to the embodiments described, such a configuration may increase distances between adjacent die areas 110, though can also allow for the input/output region 114 to be placed closer to the core region 112 since the inner metallic seal 164 is not located between the input/output region 114 and the core region 112. The outer metallic seal 162 can now be considered an additional, or surplus, metallic seal structure which can be located in the scribe region 125 to potentially reduce distance between adjacent die areas 110 if the outer metallic seal 162 can be located in a typical scribe region width. Furthermore, the additional second inner metallic seal 166 can provide an additional barrier to line of sight, providing mechanical protection and further elongating a diffusion length. Likewise, more upper metallic seals and lower metallic seals can be added to meet reliability goals. An additional variation is illustrated in FIG. 9, in which the inner metallic seal 164 is a partial metallic seal including both a partial upper metallic seal 164A and partial lower metallic seal 164B and vertical opening 161 therebetween to accommodate passage of the die-to-die routing 130.

Figure 10:
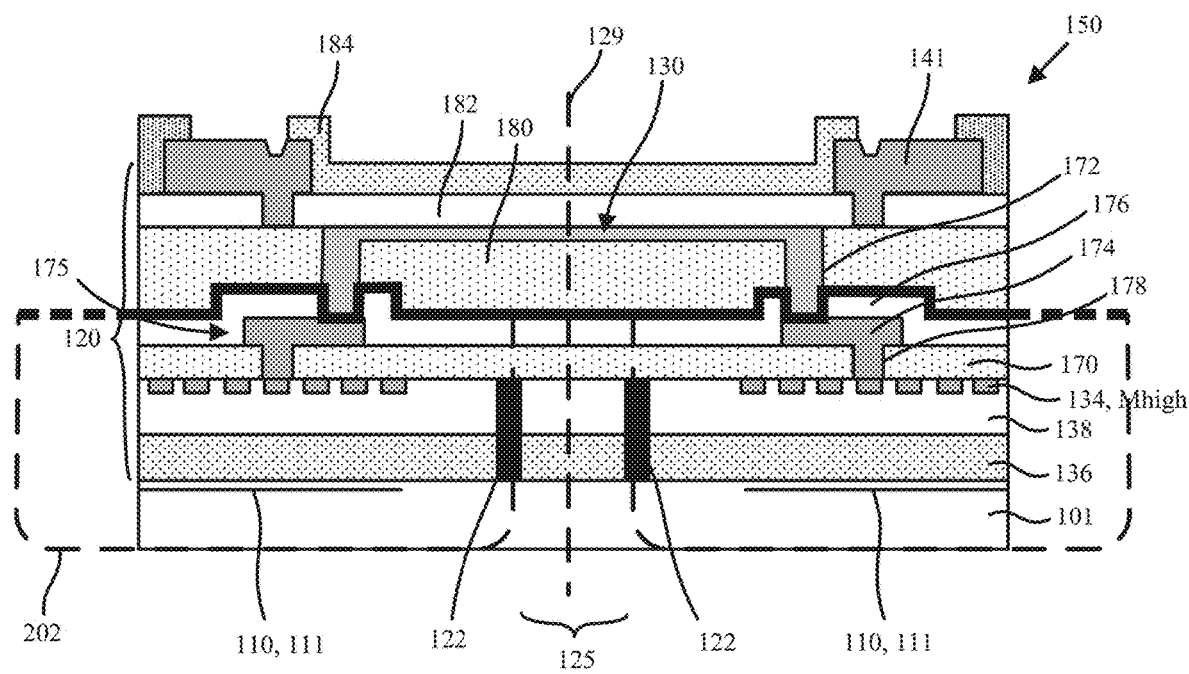
FIG. 10 is a schematic cross-sectional side view illustration of a sealed box structure with die-to-die routing landing on a passivated test pad layer in accordance with an embodiment.
Figure 11:
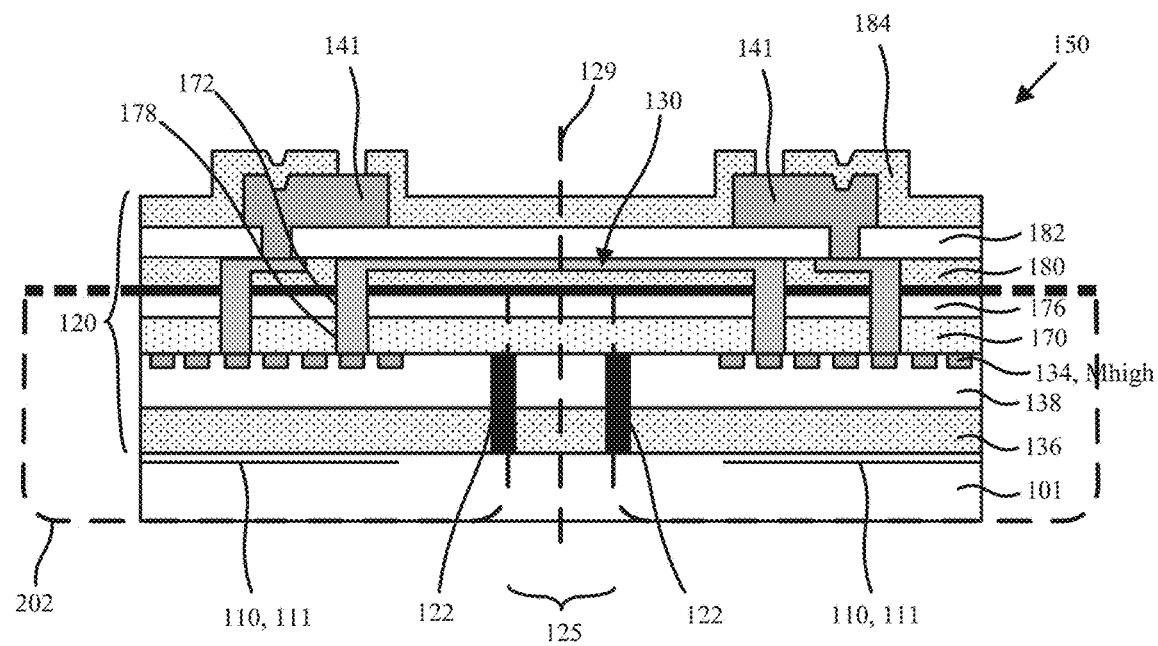
FIG. 11 is a schematic cross-sectional side view illustration of a sealed box structure with die-to-die routing landing on an upper metallization layer in accordance with an embodiment.

Thus far embodiments have been described in which the die-to-die routing 130 is in the form of through seal interconnects 169 extending through split metallic seal structures 160. Embodiments described herein also include additional sealed box structures. Generally, this may be accomplished at the expense of adding additional processing layers, while removing reliability concerns of partial/split metallic seal structures. FIG. 10 is a schematic cross-sectional side view illustration of a chip 150 including sealed box structures 202 for adjacent die areas 110 with die-to-die routing 130 landing on a passivated test pad layer 175 in accordance with an embodiment. FIG. 11 is a schematic cross-sectional side view illustration of a chip 150 including sealed box structures 202 for adjacent die areas 110 with die-to-die routing 130 landing on an upper metallization layer ($M_{high}$) in accordance with an embodiment. Generally, the sealed box structure 202 passivates the active area of the die to block moisture ingress, ion diffusion, oxidation etc. and protect the sensitive layers from environment. Typical materials include metal layers and passivation layers, such as inorganics (e.g. silicon, nitrides, carbides, oxides) as well as some polymers (e.g. polymers for more tolerant devices or applications).

Referring to both FIGS. 10-11, the chip structure 150 may include a semiconductor substrate 101, and FEOL die areas 110 patterned into the semiconductor substrate 101. Illustrated in FIG. 10 are devices 111 (e.g. transistors) of the device areas 110. A BEOL build-up structure 120 is formed over the semiconductor substrate 101 including a plurality of metallization layers 134 as previously described. Additionally, metallic seals 122 (e.g. full metallic seals) are formed extending from the lower metallization layers ($M_{low}$) to the upper metallization layers ($M_{high}$). A passivation layer 170 is located over the upper metallization layer ($M_{high}$) and directly one the metallic seal 122. In this manner, the metallic seal 122 provides side sealing, while the passivation layer 176 provides top sealing for the sealed box structures 202. As shown, openings 172 can be formed in the passivation layer 176 and die-to-die routing 130 fills the openings 172 and extends into a scribe region 125 laterally outside of the metallic seal 122. In this case the metal-filled openings 172 (or vias) also contributed to the sealed box structures 202.

Referring now specifically to FIG. 10, a lower passivation layer 170 may be formed over the upper metallization layers ($M_{high}$) and patterned to form openings 178 exposing the upper metallization layer ($M_{high}$). A test pad layer 175 is formed over the lower passivation layer 170 and within the openings 178 and patterned to form metal pads 174. In an embodiment, the test pad layer 175 and metal pads 174 are formed of aluminum, while the metallization layers 134 are formed of copper. In such a configuration, some metal pads 174 can be reserved for testing, while others are used for additional interconnection, including die-to-die routing 130. As illustrated, the passivation layer 176 is formed over the test pad layer 175, patterned to form openings 172 exposing the metal pads 174, and the die-to die routing 130 is formed filling the openings 172 and extending into the scribe region 125. Formation of die-to-die routing 130 may include dielectric layers 180 and metallization layers are previously described with dielectric layers 138 and metallization layers 134. A top passivation layer 182 can then be formed over the die-to-die routing 130 and dielectric layers 180, patterned to form openings and chip contact pads 141 located over the top passivation layer 182. A final passivation layer 184 can then be formed over the chip contact pads 141 and patterned to expose the chip contact pads 141.

Rather than contacting a test pad layer 175 as in FIG. 10, in the embodiment illustrated in FIG. 11 die-to-die routing 130 can build directly on the upper metallization layer ($M_{high}$). As shown, an optional lower passivation layer 170 and passivation layer 176 can be formed over the upper metallization layer ($M_{high}$) and patterned to form openings 178, 172, and die-to-die routing 130 formed filling the openings 178, 172 (which can be one or more vias). Formation of die-to-die routing 130 may include dielectric layers 180 and metallization layers are previously described with dielectric layers 138 and metallization layers 134. A top passivation layer 182 can then be formed over the die-to-die routing 130 and dielectric layers 180, patterned to form openings and chip contact pads 141 located over the top passivation layer 182. A final passivation layer 184 can then be formed over the chip contact pads 141 and patterned to expose the chip contact pads 141.

Similar to previously described embodiments, dicing may optionally be performed though the scribe region 125, resulting in terminal ends of the die-to-die routing 130 along chip 150 edges. Where dicing is not performed between die areas 110 the die-to-die routing 130 may connect adjacent die areas 110 of adjacent dies 104.

Figure 12:
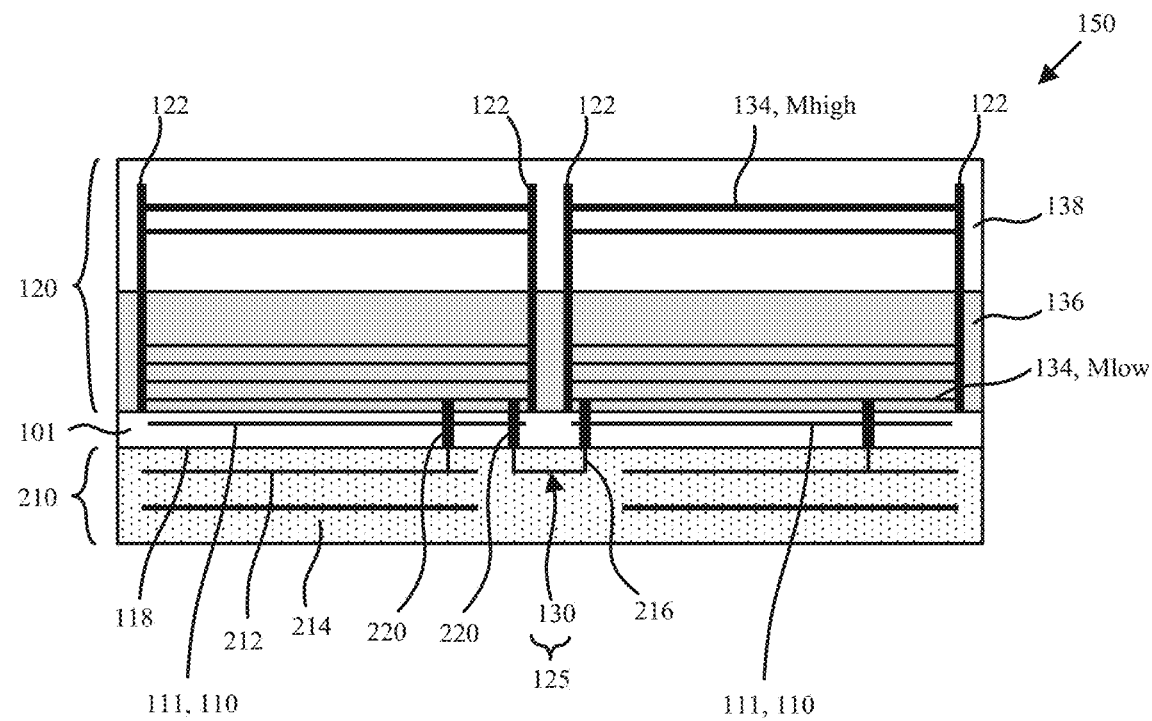
FIG. 12 is a schematic cross-sectional side view illustration of a back side die-to-die routing including nano-vias in accordance with an embodiment.
Figure 13:
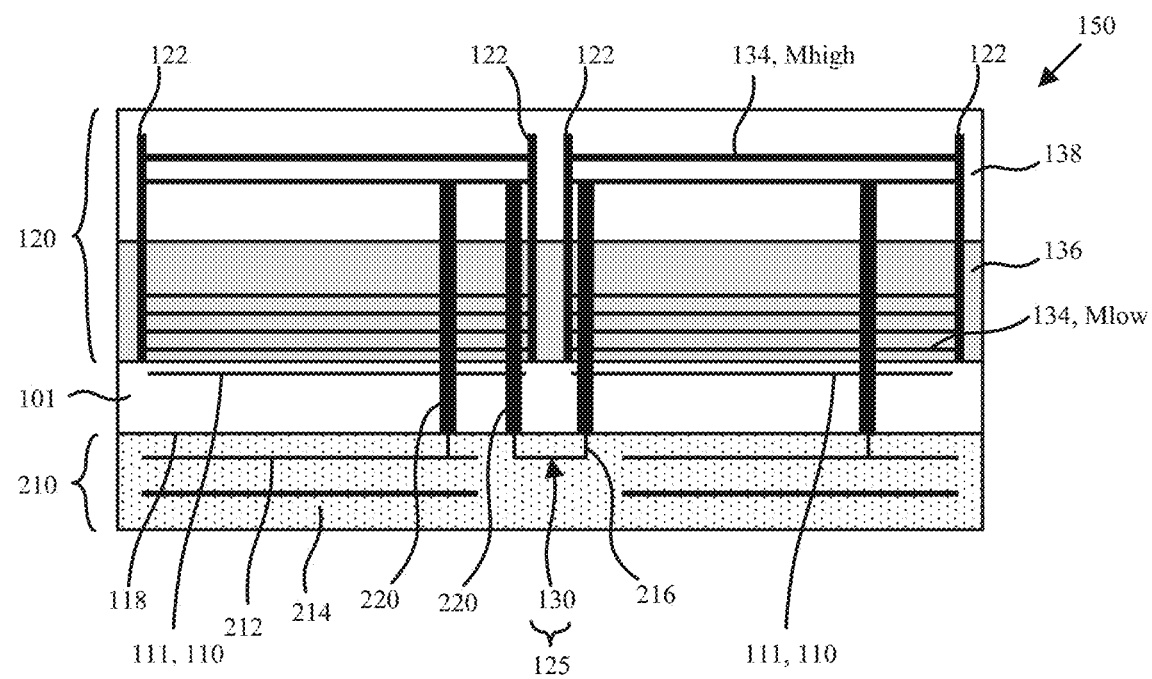
FIG. 13 is a schematic cross-sectional side view illustration of a back side die-to-die routing including micro-vias in accordance with an embodiment.

Thus far embodiments have been described in which the die-to-die routing 130 can be formed through metallic seal structures, or over metallic seal structures. Referring now to FIGS. 12-13 additional embodiments are described in which die-to-die routing 130 can be realized on a back side of the semiconductor substrate 101 facilitating through silicon vias (TSV) and backside routing layers 210 (which can also be generally referred to as backside metallization). Similar to previous descriptions, the chip structures 150 include a semiconductor substrate 101, FEOL die areas 110 patterned into the semiconductor substrate, and a BEOL build-up structure 120 including a plurality of metallization layers 134 including a lower metallization layer ($M_{low}$) and an upper metallization layer ($M_{high}$) spanning over the first FEOL die area 110 (illustrated as devices 111). Metallic seals 122 extend from the lower metallization layer to the upper metallization layer. A passivation layer may be formed over the upper metallization layer and directly on the metallic seals 122 to preserve a sealed box structure. As illustrated in both FIGS. 12-13 a die-to-die routing 130 can extend from the first FEOL die area 110, through the semiconductor substrate 101 to a back side 118 of the semiconductor substrate 101, and over into a scribe region 125 laterally outside of the metallic seal 122.

The die-to-die routing 130 may be formed with vertical interconnects 220 and a backside routing layer 210. Vertical interconnects 220 may include through vias (e.g. TSVs)

through the semiconductor substrate 101 (e.g. silicon). The vertical interconnects can further extend to metallization layers in the BEOL build-up structure 120. These may be the same vias (e.g. TSVs) or additional vias (e.g. vias 132) from the BEOL build-up structure 120. The backside routing layer 210 may be formed using thin film processing techniques or conventional BEOL build-up structure techniques including damascene structures. In an embodiment, the backside routing layer 210 includes metal wiring layers 212, dielectric layers 214 and vias 216 extending through the dielectric layers.

In the particular embodiment illustrated in FIG. 12 the vertical interconnects 220 may include nano-vias which can be built right into the FEOL process in the semiconductor substrate 101. As shown, the interconnects with nano via TSVs may connect to the devices 111, and may extend partially through or completely through to the back side 118 of the semiconductor substrate 101. Furthermore, the nano-vias may be high densities (tens or hundreds of nm in pitch), and the semiconductor substrate 101 may be thinned to less than a 500 nm thickness in some embodiments. The nano-vias may optionally be connected to vias within the BEOL build-up structure 120 to connect to a metallization layer within the BEOL build-up structure 120, such as to a lower metallization layer 134 ($M_{low}$). The vertical interconnects 220 may be connected to any metallization layer within the BEOL build-up structure. In this manner, the vertical interconnects 220 of the die-to-die routing 130 can extend from a metallization layer within the BEOL build-up structure and through the FEOL die area 110 to a back side 118 of the semiconductor substrate 101 where the die-to-die routing 130 can be completed.

In the particular embodiment illustrated in FIG. 13 the vertical interconnects 220 may include micro-vias which can extend through a thicker semiconductor substrate 101, such as several microns thick. Additionally, micro-vias may have a pitch on the order of microns. Still referring to FIG. 13, the micro-via TSVs of the vertical interconnects 220 may optionally be connected to vias (e.g. vias 132) within the BEOL build-up structure 120 to connect to a metallization layer within the BEOL build-up structure 120, such as to a mid-level or upper metallization layer 134 ($M_{high}$). The vertical interconnects 220 may be connected to any metallization layer within the BEOL build-up structure. In this manner, the vertical interconnects 220 of the die-to-die routing 130 can extend from a metallization layer within the BEOL build-up structure and through the FEOL die area 110 to a back side 118 of the semiconductor substrate 101 where the die-to-die routing 130 can be completed.

In both cases using backside routing layer 210 to complete the die-to-die routing 130 allows for connections to be made without compromising the metallic seals 122, and particularly the low-k dielectrics that may be particularly susceptible to moisture penetration. Additionally, fine wires may be available on the back side 118 of the semiconductor substrate, allowing for high wiring density. Additionally, the back side wiring may be used in addition to routing on the front side of the semiconductor substrate 101 for additional bandwidth. Similar to previously described embodiments, dicing may optionally be performed though the scribe region 125, resulting in terminal ends of the die-to-die routing 130 along chip 150 edges. Where dicing is not performed between die areas 110 the die-to-die routing 130 may connect adjacent die areas 110 of adjacent dies 104.

Thus far embodiments have been described in which physical die-to-die routing 130 structures can be formed through metallic seal structures, over metallic seal structures, or behind the metallic seal structures. Embodiments also describe chip structures in which electromagnetic field communication structures can be used for wireless die-to-die communication. For example, coils or capacitors (or other electromagnetic structure like coupled lines, waveguides, etc.) can be used to facilitate coupling across a sealing structure, such as the dielectric passivation layer (or thinner metal layers) or the metallic seal structure.

Figure 14A:
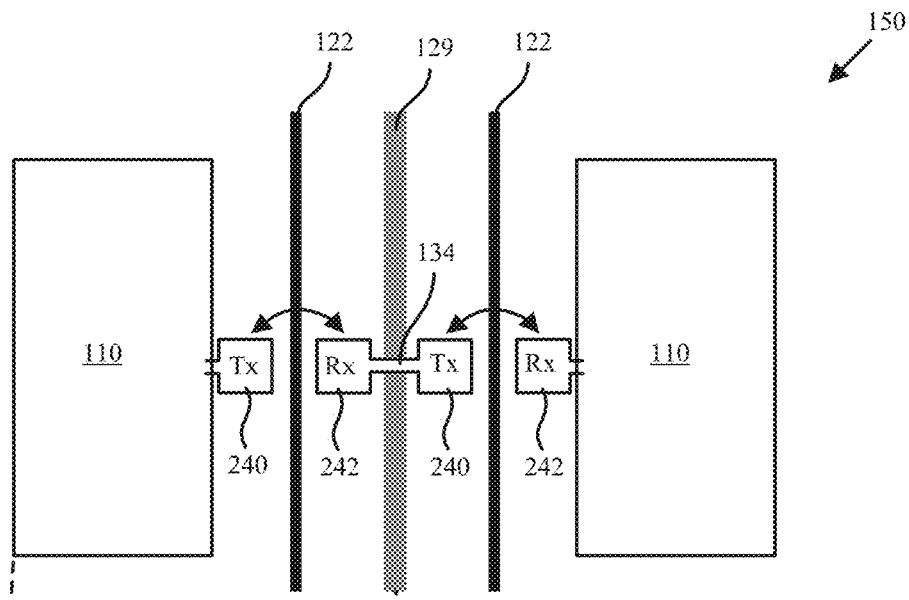
FIG. 14A is a schematic top view illustration of a die-to-die routing including electromagnetic field communication structures in accordance with an embodiment.
Figure 14B:
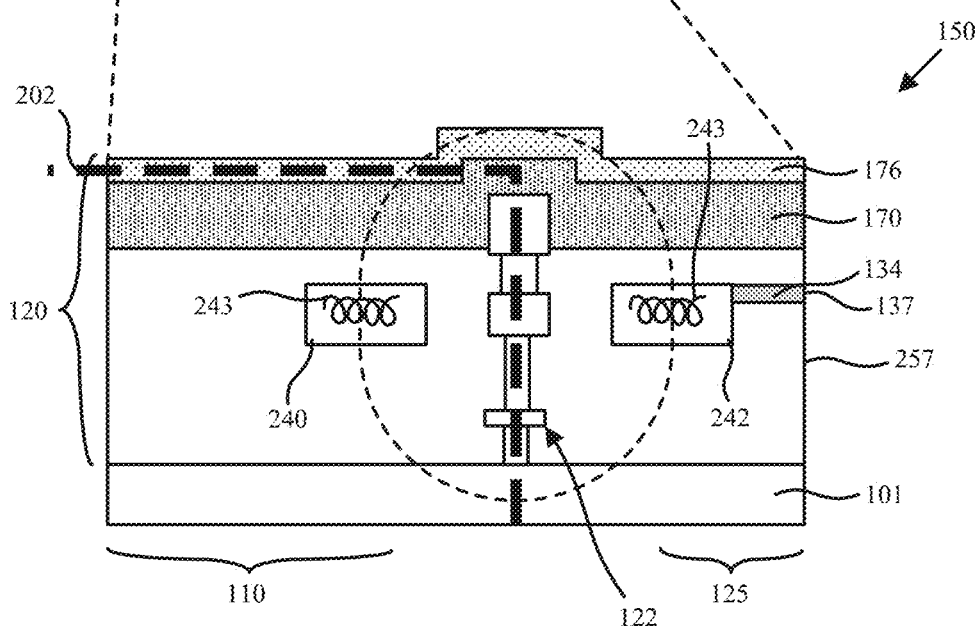
FIG. 14B is a schematic cross-sectional side view illustration of the die-to-die routing including electromagnetic field communication structures of FIG. 14A in accordance with an embodiment.

Referring now to FIGS. 14A-14B, FIG. 14A schematic top view and cross-sectional side view illustrations are provided of a die-to-die routing 130 including electromagnetic field communication structures across a metallic seal 122 in accordance with an embodiment. For example, the electromagnetic field communication structures may function as transceivers 240 (Tx) and receivers 242 (Rx) across the metallic seals 122. There may optionally be repeaters in the scribe region between the receivers 242 and transceivers 240 (e.g. where scribe line 129 is illustrated), that receive input from receivers 242 and retransmit on transceivers 240. The repeaters may optionally include active elements. Referring to FIG. 14B, similar to previously described embodiments, the chips 150 can include a semiconductor substrate 101 including device areas 110 and a BEOL build-up structure 120. Metallic seals 122 may extend from lower metallization layers to upper metallization layers, and be capped with one or more lower passivation layers 170 or passivation layers 176 to form a sealed box structure 202. In the embodiment illustrated in FIGS. 14A-14B, the transceivers 240 and receivers 242 include coils 243 for magnetic coupling. Alternatively, the transceivers and receives can include capacitor plates for capacitive coupling. In an embodiment, the transceiver 240 is located over the die area 110 interior to the metallic seal 122, while the receiver 242 is located within or adjacent the scribe region 125 exterior to the metallic seal, or vice versa. Additionally, metallization layer 134 wiring may be connected to the electromagnetic field communication structure (e.g. the transceiver or receiver) in the scribe region 125. For capacitive coupled structures, the metallization layer 134 wiring may be a wire, whereas for magnetic coupled structures metallization layer 134 wiring may be a loop formed by two wires. Similar to previously described embodiments, dicing may optionally be performed though the scribe region 125, resulting in terminal ends of the die-to-die routing 130 (metallization layer 134) along chip 150 edges. Where dicing is not performed between die areas 110 the die-to-die routing 130 may connect adjacent die areas 110 of adjacent dies 104.

Figure 15A:
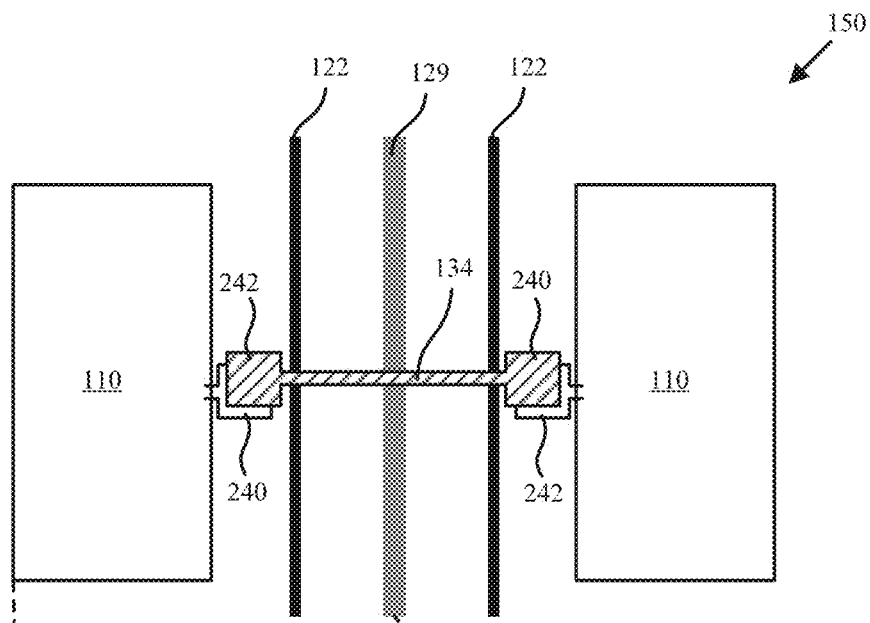
FIG. 15A is a schematic top view illustration of a die-to-die routing including electromagnetic field communication structures in accordance with an embodiment.
Figure 15B:
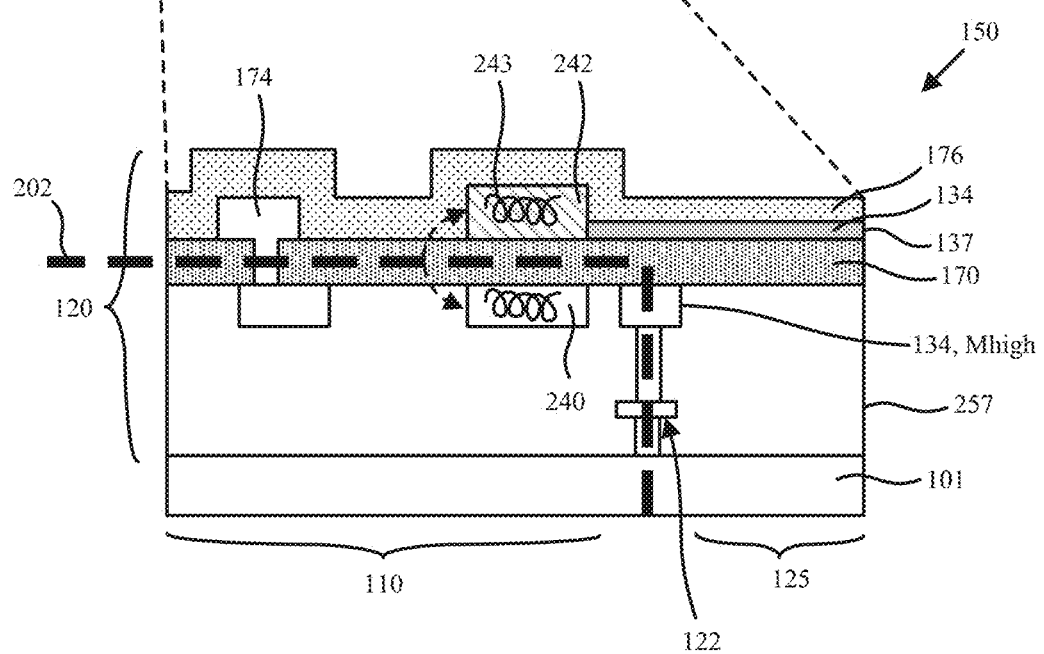
FIG. 15B is a schematic cross-sectional side view illustration of the die-to-die routing including electromagnetic field communication structures of FIG. 15A in accordance with an embodiment.

FIGS. 15A-15B include schematic top view and cross-sectional side view illustrations of a die-to-die routing 130 including electromagnetic field communication structures across a passivation layer 170 in accordance with an embodiment. Thus, the electromagnetic field communication structures are formed over/under a passivation layer forming the sealed box structure 202. Such a configuration can be well aligned with technology and provide strong coupling across the (dielectric passivation layer 170, with less parasitics than when coupling across a metal seal structure. In the exemplary embodiment illustrated, the test pad layer 175 is used to form the top electromagnetic field communication structure (e.g. receiver 242) while the top metallization layer ($M_{high}$) is used to form the bottom electromagnetic field communication structure (e.g. transceiver 240), or vice versa. As shown, a metallization layer 134 may be formed between the lower passivation layer 170 and passivation layer 176 into the scribe region 125. For capacitive coupled structures, the metallization layer 134 wiring may be a wire, whereas for magnetic coupled structures metallization layer 134 wiring may be a loop formed by two wires. Similar to previously described embodiments, dicing may optionally be performed though the scribe region 125, resulting in terminal ends of the die-to-die routing 130 (metallization layer 134) along chip 150 edges. Similarly, there may be repeater structures in the scribe region 125 (e.g. along metallization layer 134 between connected transceiver 240 and receiver 242). Where dicing is not performed between die areas 110 the die-to-die routing 130 may connect adjacent die areas 110 of adjacent dies 104. Likewise, similar to FIGS. 14A-14B, while coils 243 are illustrated in the receiver 242 and transceiver 240 for magnetic coupling, the transceivers and receivers can alternatively include capacitor plates for capacitive coupling.

In accordance with embodiments a chip 150 structure may include a semiconductor substrate 101, a first front-end-of-the-line (FEOL) die area 110 of a first die patterned into the semiconductor substrate, and a back-end-of-the-line (BEOL) build-up structure 120 including a sealed box structure 202 including a metallic seal 122 and one or more passivation layers 170 over the metallic seal 122 to provide a barrier to environment. The chip 150 further includes a die-to-die routing 130 extending from the first FEOL die area 110 and into a scribe region outside of the sealed box structure, wherein the die-to-die routing additionally includes an electromagnetic field communication structure including a transceiver 240 and a receiver 242 to wirelessly communicate across the sealed box structure 202.

The transceiver 240 and receiver 242 may each include a coil 243 for magnetic coupling across the sealed box structure 202. The transceiver 240 and receiver 242 may each include a capacitor for capacitive coupling across the sealed box structure 202. In an embodiment, the transceiver and the receiver are located on laterally opposite sides of the metallic seal 122. In an embodiment, transceiver and the receiver are vertically oriented on opposite sides of a first passivation layer 170 of the one or more passivation layers. In an embodiment, the chip 150 further includes a chip edge 257 in a scribe region 125, and a terminal end 137 of the die-to-die routing at the chip edge 257. In an embodiment, the die-to-die routing extends from a scribe region 125 to a second FEOL die area 110 of a second die patterned into the semiconductor substrate 101.

The electromagnetic field communication structures in accordance with embodiments can also include photonic waveguides. For example, photonic wafers and chips may also use the stitched die and harvesting techniques described herein. The wafers may be native photonic materials, or assembled (e.g. wafer, or chip on wafer bonded) with complementary metal oxide semiconductor (CMOS) and photonic wafers.

It may be feasible that the photonic waveguides are of sufficient reliability (e.g. oxide, nitride construction) that they may be diced, without hazard. In such these may support planar (2D) solutions. In such a case, the sensitive circuits and photonics stays with a sealed box, such as FIGS. 10-11 where the critical elements are protected on all sides. Only the diced waveguide is exposed, but is immune because of its material set and construction, and the overall die stays safe. If the waveguide materials need reliability enhancements, or are known to be susceptible, the diced facet may be passivated, thereby providing the protection. An alternative to passivation, the effective distance to active or sensitive elements may be increased using tight meanders (tradeoff with optical loss). In addition, metallic seals 122 can be placed between meander paths, such that substantial metal walls exist as partial seal ring. In an embodiment, waveguides can also be incorporated with metallic seal structures. For example, the waveguides can meander through partial metallic seal structures within a same layer (e.g. if FIGS. 8-9 instead were top view).

In addition, a full metallic seal wall may be negotiated in the third dimension using optical vias, couplers, mirrors or additional waveguides, or photonic wire bonds. For example, such structures may be compatible with the sealed box structures described herein such as FIGS. 10-11, with the waveguide optionally formed in an overlying passivation layer 176, 182 or dielectric layer 180. The sensitive elements (CMOS or photonic) are within a sealed box. A waveguide can couple one die to the other. The vertical photonic communication may be assisted using faceted mirrors, grating couplers, photonic vias. Communication to other die may be using waveguides, photonic wire bonds etc. Similar to the electromagnetic field communication structures using magnetic or capacitive coupling, the electromagnetic field communication structures including waveguides may include optical transceivers and optical receivers. Referring to previously described FIG. 14A such a transceiver 240 and receiver 242 can be located on opposite sides of the metallic seal 122, or alternatively inside the metallic seals 122 of the corresponding adjacent die areas 110 (and thus communicate across two adjacent sealed box structures). Repeaters may optionally be located therebetween. In an embodiment, scribing between the two die areas 110 along scribe line 129 may proceed through the waveguide material, resulting in adjacent chips, one including a transceiver 240 and the other including the receiver 242. Similarly, referring to previously described FIG. 15A, such a transceiver and receiver 242 can be located on opposite sides of the passivation layer 170, or alternatively inside the metallic seals 122 of the corresponding adjacent die areas 110 (and thus communicate across two adjacent sealed box structures). Repeaters may optionally be located therebetween. In an embodiment, scribing between the two die areas 110 along scribe line 129 may proceed through the waveguide material, resulting in adjacent chips, one including a transceiver 240 and the other including the receiver 242.

The electromagnetic field communication structures in accordance with embodiments thus far have been described as being connected to waveguides, photonic wire bonds, metallization layers 134 of the BEOL build-up structure 120, etc. Alternatively, at least one of the transceivers 240 or receivers 242 can be located in a chiplet (e.g. smaller silicon die that may be passive or active) to connect between adjacent die areas 110 or chips 150.

Figure 16:
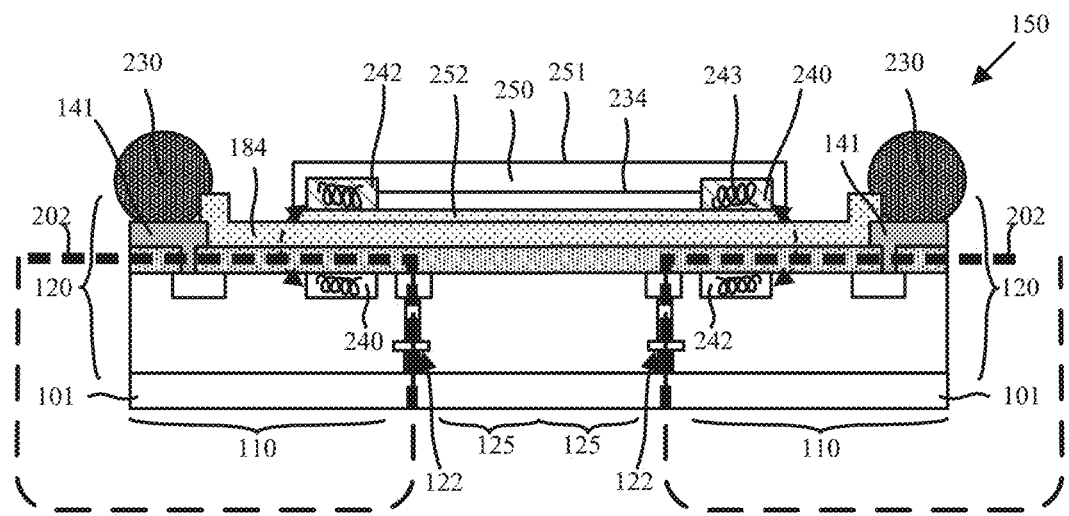
FIG. 16 is a schematic cross-sectional side view illustration of the die-to-die routing including a chiplet with electromagnetic field communication structures connecting two adjacent die areas in accordance with an embodiment.

FIG. 16 is a schematic cross-sectional side view illustration of the die-to-die routing including a chiplet 250 with electromagnetic field communication structures connecting two adjacent die areas 110 in accordance with an embodiment. The electromagnetic coupling may be capacitive or inductive. As shown, the adjacent die areas 110 may be enclosed within respective sealed box structures 202. In particular, FIG. 16 may be similar to that of FIG. 15B, where instead a chiplet including a transceiver 240 and receiver 242 are used to communicate with a corresponding receiver 242 and transceiver 240 within adjacent die areas 110, formed in the same semiconductor substrate 101. Bonding of the chiplet 250 may be achieved by fusion bonding, for example between two dielectric layers such as $SiO_2$. Such a dielectric-dielectric fusion bonding process can be less expensive and less complex than hybrid bonding, and use finer pad pitch compared to solder bumping (e.g. micro bumps). Using thin dielectric between coupled structures with good alignment accuracy can keep signal levels high, mitigate cross-talk, and facilitate dense pad pitch. In the exemplary embodiment illustrated fusion bonding is performed between a dielectric layer 252 on the chiplet 250 and passivation layer 184 formed over the chip 150.

The chiplet 250 in accordance with embodiments may be a purely passive component including routing 234, or may be active. Solder bumps 230 may optionally be placed on chip contact pads 141. Solder bumps 230 may optionally be laterally adjacent the chiplet 250. Alternatively, the chiplet 250 can be embedded within a routing layer. As shown, the chiplet may include routing 234 to complete the die-to-die routing. The chiplet 250 may be passive or active. Active chiplets can support repeaters. Where chiplet 250 is active, through silicon vias (TSVs) may be formed through the chiplet for back side 251 connection (e.g. for power). Alternatively, power can be capacitively or inductively coupled, and TSVs are not required.

The chiplets 250 in accordance with embodiments may include electromagnetic field communication structures for connecting multiple chips 150, where the individual chips 150 already include sealed box structures, or similar sealing structures. Thus, the electromagnetic filed communication structures can be extended to the package level without disrupting the sealing structures of the individual chips to be connected.

Figure 17:
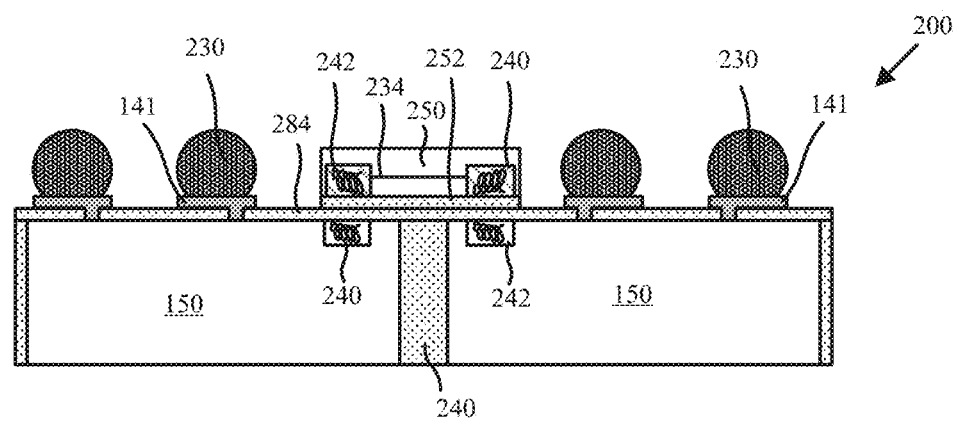
FIG. 17 is a schematic cross-sectional side view illustration of the die-to-die routing including a chiplet with electromagnetic field communication structures connecting two adjacent chips in accordance with an embodiment.

FIG. 17 is a schematic cross-sectional side view illustration of the die-to-die routing including a chiplet 250 with electromagnetic field communication structures connecting two adjacent chips 150 in accordance with an embodiment. Chips 150 may be the same type of chips, or different type of chips. The chips 150 may be similar to any of the chips 150 described herein, and may include full metallic seal structures. As shown, a package 200 can include a two or more chips 150 embedded in an encapsulation material 240, such as molding compound material or dielectric fill material. A package level passivation layer 284 can optionally be formed over the encapsulated chips 250 and the encapsulation material 240. Package contact pads 241 and vias may be formed through the package level passivation layer 284 to contact the individual chips 150. A chiplet 250 can be fusion (dielectric-dielectric) bonded to the package level passivation layer 184 as previously described with the passivation layer 184. Alternatively, the chip 250 can be fusion bonded to the passivation layers 184 of the individual chips 150.

Figure 18:
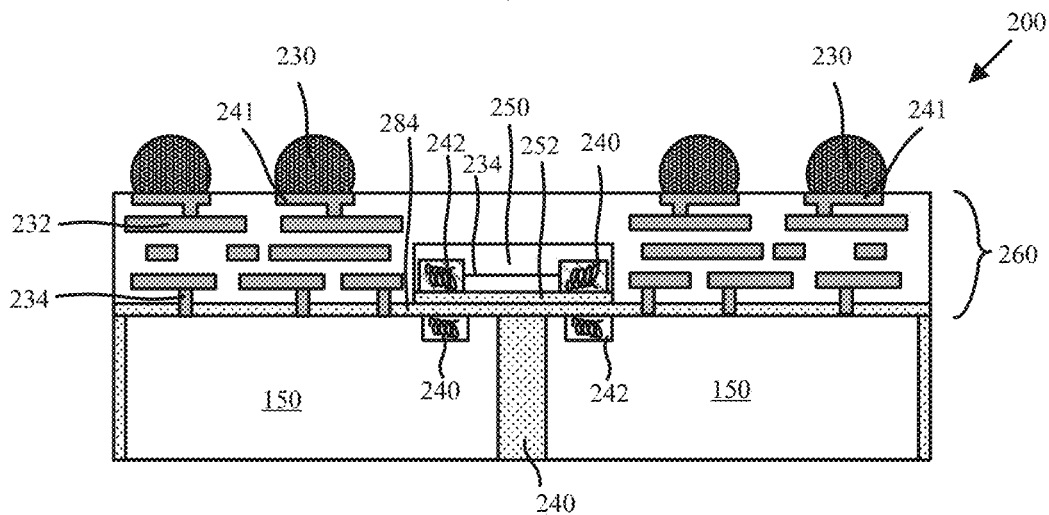
FIG. 18 is a schematic cross-sectional side view illustration of the die-to-die routing including a chiplet embedded within a package level routing layer, the chiplet including electromagnetic field communication structures connecting two adjacent chips in accordance with an embodiment.

FIG. 18 is a schematic cross-sectional side view illustration of the die-to-die routing including a chiplet 250 embedded within a package level routing layer 260, the chiplet 250 including electromagnetic field communication structures connecting two adjacent chips 150 in accordance with an embodiment. FIG. 18 is substantially similar to FIG. 17 with the addition of the package level routing layer 260 including metallization layers 234 (wiring layers), vias 232 and package contact pads 241. In an alternatively embodiment, the chiplet 250 of FIG. 16 could be embedded within a similar wiring layer 260 for chip 150, effectively extending the BEOL build-up structure 120. Summarizing, various methods for die-to-die connection have been described that use a combination of techniques, using FEOL, BEOL, through silicon vias, chiplets, and multiple types of electromagnetic structures (capacitive, magnetic, and optical/photonic) while maintaining reliability for diced parts. In utilizing the various aspects of the embodiments, it would become apparent to one skilled in the art that combinations or variations of the above embodiments are possible for forming seal structures that support efficient die-to-die routing. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A structure comprising:
a semiconductor substrate;
a first front-end-of-the-line (FEOL) die area of a first die patterned into the semiconductor substrate;
a second FEOL die area of a second die patterned into the semiconductor substrate; and
a back-end-of-the-line (BEOL) build-up structure including:
a first metallic seal surrounding the first FEOL die area,
a second metallic seal surrounding the second FEOL die area,
one or more passivation layers spanning over the first FEOL die area, the second FEOL die area, the first metallic seal and the second metallic seal to provide a first sealed box structure over the first die area and a second sealed box structure over the second die area; and
an optical communication path spanning over the first sealed box structure and the second sealed box structure to connect the first die area to the second die area.

2. The structure of claim 1, wherein the optical communication path comprises a waveguide.

3. The structure of claim 2, wherein the optical communication path comprises a photonic wire bond.

4. The structure of claim 1, further comprising an electromagnetic field communication transceiver in the BEOL build-up structure within the first sealed box structure.

5. The structure of claim 4, further comprising an electromagnetic field communication receiver in the BEOL build-up structure within the second sealed box structure.

6. The structure of claim 4, further comprising:
a second electromagnetic field communication receiver directly over the one or more passivation layers and the electromagnetic field communication transceiver within the first sealed box structure;
a second electromagnetic field communication transceiver directly over the one or more passivation layers and the electromagnetic field communication receiver within the second sealed box structure;
wherein the optical communication path is coupled between the second electromagnetic field communication receiver and the second electromagnetic field communication transceiver.

7. The structure of claim 4, further comprising an optical via to facilitate vertical photonic communication through the one or more passivation layers.

8. The structure of claim 4, wherein the optical communication path further comprises faceted mirrors.

9. The structure of claim 4, further comprising one or more repeaters along the optical communication path.

10. The structure of claim 4, wherein the electromagnetic field communication transceiver is an optical transceiver, and the electromagnetic field communication receiver is an optical receiver.

11. The structure of claim 4, wherein the electromagnetic field communication transceiver comprises a first coil or first capacitor plate, and the electromagnetic field communication receiver comprises a second coil or second capacitor plate.

12. A structure comprising:
a first die;

a second die;

a chiplet including a first electromagnetic field communication transceiver in wireless communication with the first die and a first electromagnetic field communication receiver in wireless communication with the second die;

wherein the first electromagnetic field communication transceiver comprises a first coil or first capacitor plate, and the first electromagnetic field communication receiver comprises a second coil or second capacitor plate.

13. The structure of claim 12, wherein:

the first die comprises a second electromagnetic field communication receiver in wireless communication with the first electromagnetic field communication transceiver of the chiplet;

the second die comprises a second electromagnetic field communication transceiver in optical communication with the first electromagnetic field communication receiver of the chiplet.

14. The structure of claim 13, further comprising a semiconductor substrate, wherein the first die includes a first front-end-of-the-line (FEOL) die area patterned into the semiconductor substrate, and the second die includes a second FEOL die area patterned into the semiconductor substrate.

15. The structure of claim 14, wherein the chiplet is fusion bonded to a package level passivation layer spanning over the first die and the second die.

16. The structure of claim 15, further comprising a back-end-of-the-line (BEOL) build-up structure spanning over the first FEOL die area and the second FEOL die area, the BEOL build-up structure comprising a first metallic seal surrounding the first FEOL die area, and a second metallic seal surrounding the second FEOL die area, wherein the second electromagnetic field communication receiver is inside of the first metallic seal and the second electromagnetic field communication transceiver is inside of the second metallic seal.

17. The structure of claim 13, wherein the first die is in a first chip and the second die is in a second chip.

18. The structure of claim 17, wherein the chiplet is fusion bonded to a package level passivation layer spanning over the first chip and the second chip.

19. The structure of claim 17, wherein the chiplet is laterally adjacent a plurality of solder bumps.

20. The structure of claim 17, wherein the chiplet is embedded in a package level redistribution layer.

21. A structure comprising:

a semiconductor substrate;

a first front-end-of-the-line (FEOL) die area of a first die patterned into the semiconductor substrate;

a second FEOL die area of a second die patterned into the semiconductor substrate; and a back-end-of-the-line (BEOL) build-up structure including:

a first metallic seal surrounding the first FEOL die area, a second metallic seal surrounding the second FEOL die area, one or more waveguides that meander through the first metallic seal and the second metallic seal.

22. The structure of claim 21, further comprising an optical transceiver in the BEOL build-up structure within the first metallic seal.

23. The structure of claim 22, further comprising an optical receiver in the BEOL build-up structure within the second metallic seal.

24. The structure of claim 22, further comprising one or more repeaters along the waveguide between the first metallic seal and the second metallic seal.

25. The structure of claim 21, further comprising:

a first optical transceiver and a first optical receiver located on laterally opposite sides of the first metallic seal; and a second optical transceiver and a second optical receiver located on laterally opposite sides of the second metallic seal.

* * * * *